(12) United States Patent
Hwang et al.

(10) Patent No.: US 11,407,678 B2
(45) Date of Patent: Aug. 9, 2022

(54) ELECTRONIC PANEL AND ELECTRONIC APPARATUS INCLUDING THE SAME

(71) Applicant: Samsung Display Co., Ltd., Yongin-si (KR)

(72) Inventors: Hyunmin Hwang, Seoul (KR); Sangyeol Kim, Hwaseong-si (KR); Woosuk Jung, Cheonan-si (KR); Young Seo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 249 days.

(21) Appl. No.: 16/888,367

(22) Filed: May 29, 2020

(65) Prior Publication Data

US 2021/0032156 A1    Feb. 4, 2021

(30) Foreign Application Priority Data

Aug. 2, 2019    (KR) .......................... 10-2019-0094361

(51) Int. Cl.
| | |
|---|---|
| *H01L 27/32* | (2006.01) |
| *C03C 8/24* | (2006.01) |
| *H04M 1/02* | (2006.01) |
| *C03C 8/14* | (2006.01) |
| *H01L 51/52* | (2006.01) |

(52) U.S. Cl.
CPC .................. *C03C 8/24* (2013.01); *C03C 8/14* (2013.01); *H01L 27/3272* (2013.01); *H01L 27/3276* (2013.01); *H01L 51/5237* (2013.01); *H01L 51/5246* (2013.01); *H01L 51/5281* (2013.01); *H01L 51/5284* (2013.01); *H04M 1/0264* (2013.01); *H04M 1/0266* (2013.01); *H01L 27/323* (2013.01)

(58) Field of Classification Search
CPC ............. H01L 27/3272; H01L 27/3276; H01L 27/323; H01L 51/5246; H01L 51/5281; H04M 1/0264; H04M 1/0262; C03C 8/14
USPC ........................................................ 349/153
See application file for complete search history.

(56) References Cited

U.S. PATENT DOCUMENTS

| | | | |
|---|---|---|---|
| 9,130,191 B2 | 9/2015 | Jung et al. | |
| 10,267,976 B1* | 4/2019 | Zheng | G02B 6/0045 |
| 10,996,503 B2* | 5/2021 | Yu | G02F 1/133514 |

(Continued)

FOREIGN PATENT DOCUMENTS

| | | |
|---|---|---|
| JP | 2004-329687 A | 11/2004 |
| JP | 2010-139657 A | 6/2010 |

(Continued)

*Primary Examiner* — Christopher M Raabe
(74) *Attorney, Agent, or Firm* — Lewis Roca Rothgerber Christie LLP

(57) ABSTRACT

An electronic panel includes: a base substrate divided into a hole region including a hole transmissive region overlapping an electronic module when viewed in a plan view and a light shielding region adjacent to the hole transmissive region, an active region adjacent to the hole region, and a peripheral region adjacent to the active region; a plurality of light emitting devices spaced apart from the hole region in the active region; a light shielding pattern spaced apart from the hole transmissive region in the light shielding region; and an encapsulation substrate on the base substrate and covering the light emitting devices, wherein the light shielding pattern comprises frit.

25 Claims, 18 Drawing Sheets

(56) References Cited

U.S. PATENT DOCUMENTS

| | | | | |
|---|---|---|---|---|
| 11,137,645 B2* | 10/2021 | Baek | ................ | G02F 1/1339 |
| 2017/0148856 A1* | 5/2017 | Choi | ................ | H01L 27/3258 |
| 2017/0214003 A1* | 7/2017 | Lee | ................ | H01L 51/5262 |
| 2017/0287992 A1* | 10/2017 | Kwak | ................ | G06F 1/1686 |
| 2019/0146251 A1* | 5/2019 | Shibano | ................ | G02F 1/1341 |
| | | | | 349/153 |
| 2019/0148672 A1* | 5/2019 | Seo | ................ | H01L 27/3234 |
| | | | | 257/40 |
| 2020/0006701 A1* | 1/2020 | Lee | ................ | H01L 27/3258 |
| 2020/0124910 A1 | 4/2020 | Hwang et al. | | |
| 2020/0174295 A1* | 6/2020 | Baek | ................ | G02F 1/133308 |
| 2020/0295294 A1 | 9/2020 | Hwang et al. | | |
| 2021/0088834 A1* | 3/2021 | Yu | ................ | G02F 1/13312 |

FOREIGN PATENT DOCUMENTS

| | | |
|---|---|---|
| JP | 4562996 B2 | 10/2010 |
| KR | 10-1162042 B1 | 7/2012 |
| KR | 10-2012-0139392 A | 12/2012 |
| KR | 10-2020-0109416 A | 9/2020 |

\* cited by examiner

ELECTRONIC PANEL AND ELECTRONIC APPARATUS INCLUDING THE SAME

CROSS-REFERENCE TO RELATED APPLICATION

The present application claims to and the benefit of Korean Patent Application No. 10-2019-0094361, filed on Aug. 2, 2019, the entire contents of which are hereby incorporated by reference.

BACKGROUND

Aspects of some example embodiments of the present disclosure herein relate to an electronic panel and an electronic apparatus including the same.

An electronic apparatus may be activated according to an electrical signal. The electronic apparatus may include a display panel for displaying an image or a touch sensor for sensing an external input (e.g., a touch input from an external object such as a user's finger or a stylus). An organic light emitting display panel among display panels has relatively low power consumption, relatively high luminance, and a relatively high response speed.

Meanwhile, the electronic apparatus may include an electronic module that receives an external signal (from an external source) or provides an output signal to the outside. The electronic module is accommodated in an outer case or the like together with the display panel to constitute the electronic apparatus.

The above information disclosed in this Background section is only for enhancement of understanding of the background and therefore the information discussed in this Background section does not necessarily constitute prior art.

SUMMARY

Aspects of some example embodiments of the present disclosure herein relate to an electronic panel and an electronic apparatus including the same, and for example, to an electronic panel overlapping an electronic module and an electronic apparatus including the same.

Aspects of some example embodiments of the present disclosure include an electronic panel capable of improving aesthetics of a region overlapping an electronic module, and an electronic apparatus including the same.

According to some example embodiments of the inventive concept, an electronic panel includes: a base substrate divided into a hole region including a hole transmissive region overlapping an electronic module when viewed in a plane and a light shielding region adjacent to the hole transmissive region, an active region adjacent to the hole region, and a peripheral region adjacent to the active region, a plurality of light emitting devices spaced apart from the hole region and arranged in the active region, a light shielding pattern spaced apart from the hole transmissive region and in the light shielding region, and an encapsulation substrate on the base substrate to cover the light emitting devices, wherein the light shielding pattern includes frit.

According to some example embodiments, the frit may include a vanadium oxide.

According to some example embodiments, the light shielding pattern may be on a rear surface of the encapsulation substrate.

According to some example embodiments, the encapsulation substrate may include glass.

According to some example embodiments, the electronic panel may include a plurality of insulating layers between the base substrate and the encapsulation substrate and spaced apart from the encapsulation substrate, wherein the insulating layers are spaced apart from the hole transmissive region when viewed in a plane.

According to some example embodiments, the light shielding pattern may be in contact with any one of the encapsulation substrate and the insulating layers.

According to some example embodiments, the electronic panel may further include a hole conductive pattern in the hole region and spaced apart from the hole transmissive region to be on any one of the insulating layers. The light shielding pattern is in contact with the hole conductive pattern and the encapsulation substrate.

According to some example embodiments, the electronic panel may further include a window on the encapsulation substrate, and an anti-reflection layer between the encapsulation substrate and the window. An opening penetrating the anti-reflection layer and overlapping the hole transmissive region is defined.

According to some example embodiments, an inner surface of the opening may overlap the light shielding pattern when viewed in a plane.

According to some example embodiments, the electronic panel may further include a sensing unit which is on the encapsulation substrate and includes a plurality of sensing electrodes. The sensing electrodes are arranged to be spaced apart from the hole transmissive region when viewed in a plane.

According to some example embodiments of the inventive concept, an electronic apparatus includes: an electronic module, and an electronic panel configured to overlap the electronic module when viewed in a plane, wherein the electronic panel includes a base substrate divided into a hole region including a hole transmissive region overlapping the electronic module when viewed in a plane and a light shielding region adjacent to the hole transmissive region, an active region adjacent to the hole region, and a peripheral region adjacent to the active region, a plurality of light emitting devices spaced apart from the hole region and arranged in the active region, a light shielding pattern spaced apart from the hole transmissive region and in the light shielding region, an encapsulation substrate which is on the base substrate and includes a rear surface facing the light emitting devices and a front surface opposed to the rear surface, and a sealing member configured to bond the encapsulation substrate and the base substrate, wherein the light shielding pattern is on the rear surface of the encapsulation substrate.

According to some example embodiments, the light shielding pattern may include frit.

According to some example embodiments, the light shielding pattern may include the same material as the sealing member.

According to some example embodiments, the electronic apparatus may further include a window on the front surface of the encapsulation substrate, and an anti-reflection layer between the window and the encapsulation substrate, wherein the window overlaps the hole region when viewed in a plane, and an opening penetrating the anti-reflection layer and overlapping the hole region is defined.

According to some example embodiments, an inner surface of the opening may be aligned with an end of the light shielding pattern.

According to some example embodiments, an inner surface of the opening may overlap the light shielding pattern when viewed in a plane.

According to some example embodiments, the light transmittance of a region, of the window, overlapping the hole region may be the same as the light transmittance of a region, of the window, overlapping the active region.

According to some example embodiments, the hole transmissive region may be surrounded by the light shielding pattern when viewed in a plane.

According to some example embodiments, the hole transmissive region may be provided in plurality, the plurality of hole transmissive regions may be spaced apart from each other, and the light shielding pattern may surround each of the plurality of hole transmissive regions.

According to some example embodiments, each of the hole transmissive region and the light shielding pattern may be provided in plurality, the plurality of hole transmissive regions may be spaced apart from each other, the plurality of light shielding patterns may be spaced apart from each other, and the plurality of light shielding patterns may respectively surround the plurality of hole transmissive regions.

According to some example embodiments, the electronic module may include at least one of a camera, a speaker, a light sensor, or a heat sensor.

According to some example embodiments, the electronic panel may include signal wires in the light shielding region and connected to light emitting devices adjacent to the hole region among the light emitting devices. The signal wires are covered by the light shielding pattern when viewed in a plane.

According to some example embodiments, the light shielding pattern may be spaced apart from the signal wires when viewed in a plane.

According to some example embodiments, the electronic apparatus may further include a hole conductive pattern in the light shielding region and spaced apart from signal wires to be electrically insulated from the signal wires. The light shielding pattern is in contact with the hole conductive pattern.

According to some example embodiments, the electronic apparatus may include a plurality of insulating layers between the base substrate and the encapsulation substrate and spaced apart from the encapsulation substrate, wherein the light shielding pattern is in contact with any one of the insulating layers.

BRIEF DESCRIPTION OF THE FIGURES

The accompanying drawings are included to provide a further understanding of aspects of some example embodiments of the inventive concept, and are incorporated in and constitute a part of this specification. The drawings illustrate aspects of some example embodiments of the inventive concept and, together with the description, serve to describe principles of some example embodiments of the inventive concept. In the drawings.

DETAILED DESCRIPTION

Figure 1:
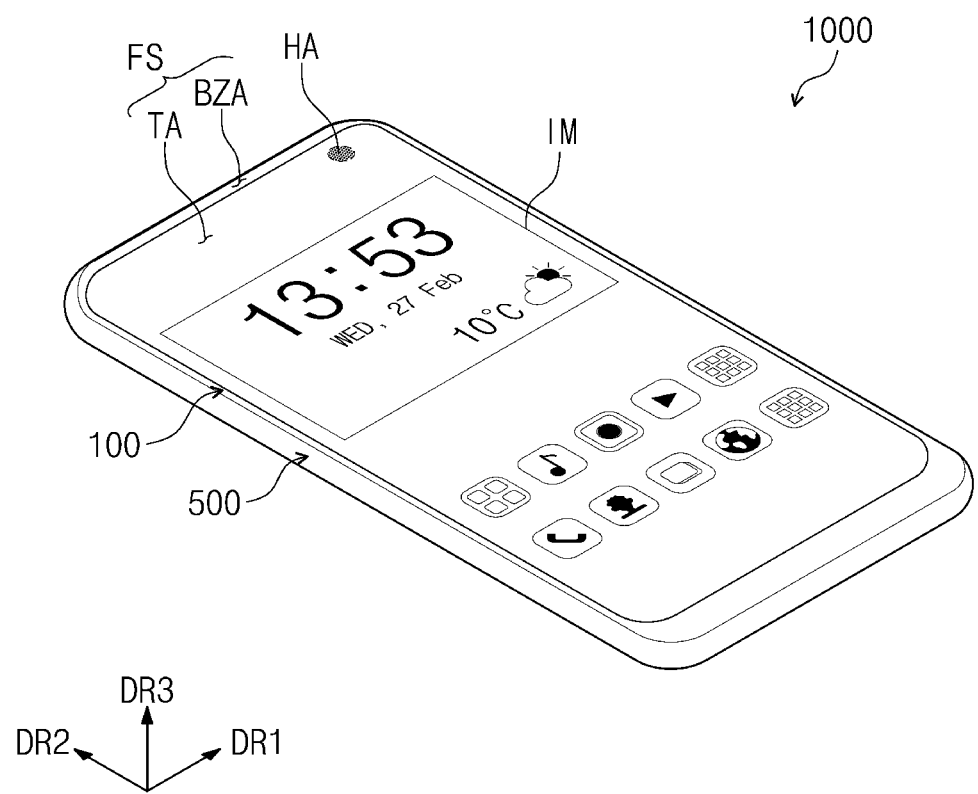
FIG. 1 is a perspective view of an electronic apparatus according to some example embodiments of the inventive concept.

It will be understood that when an element or layer (or region, portion, and the like) is referred to as being "on", "connected to" or "coupled to" another element or layer, it can be directly on, connected or coupled to the other element or layer, or intervening elements or layers may be present.

Like reference numerals refer to like elements throughout this specification. In the figures, the thicknesses, ratios and dimensions of elements are exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" or "have", when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, the present invention will be explained in detail with reference to the accompanying drawings.

Figure 2:
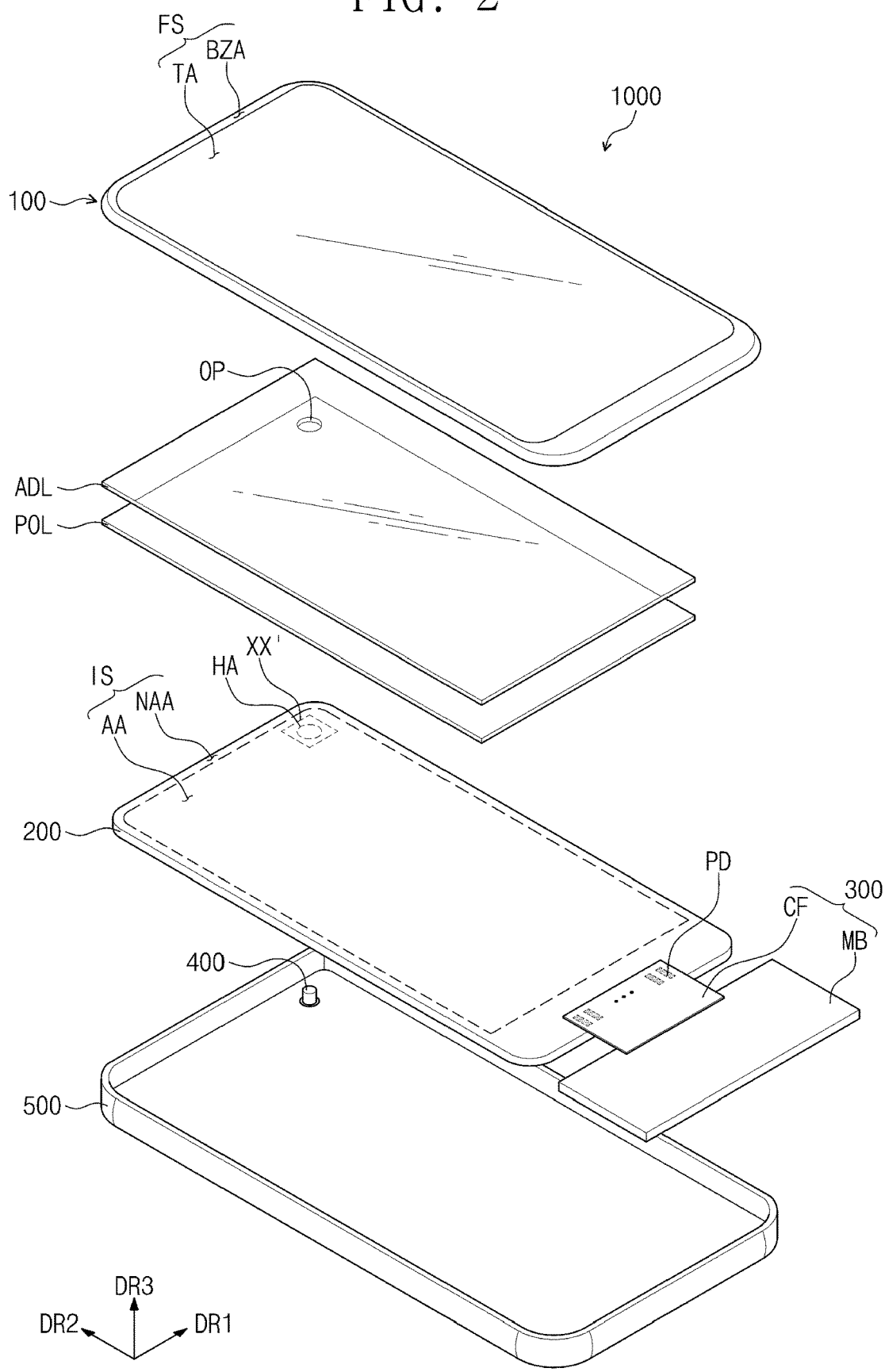
FIG. 2 is an exploded perspective view of the electronic apparatus illustrated in FIG. 1.
Figure 3:
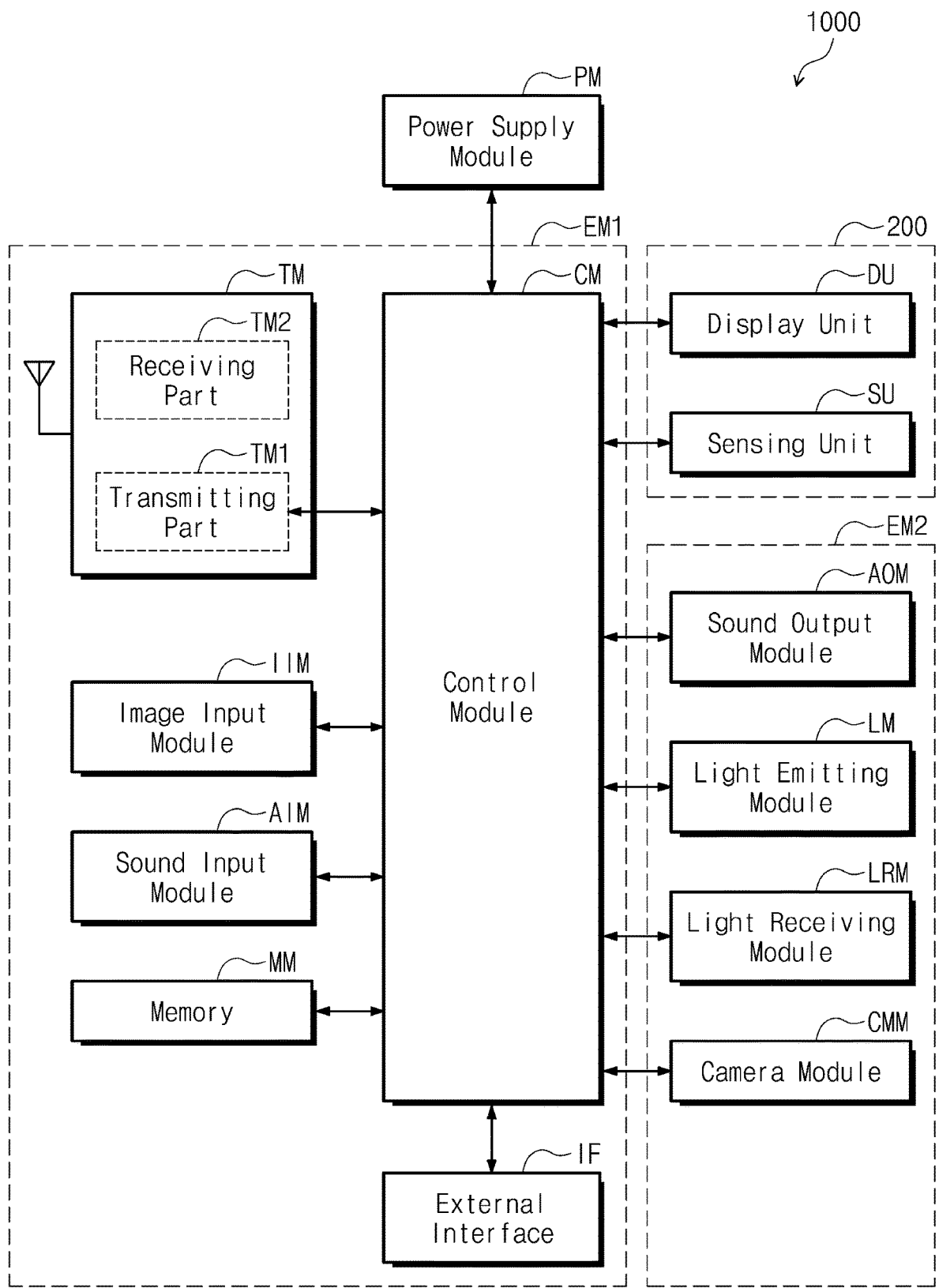
FIG. 3 is a block diagram of the electronic apparatus illustrated in FIG. 1.

FIG. 1 is a perspective view of an electronic apparatus according to some example embodiments of the inventive concept. FIG. 2 is an exploded perspective view of the electronic apparatus illustrated in FIG. 1. FIG. 3 is a block diagram of the electronic apparatus illustrated in FIG. 1. Hereinafter, further details of some example embodiments of the inventive concept will be described with reference to FIGS. 1 to 3.

An electronic apparatus 1000 may be an apparatus that is activated according to an electrical signal. The electronic apparatus 1000 may include various embodiments. For example, the electronic apparatus 1000 may include a tablet computer, a laptop computer, a personal computer, a smart television, or the like. In FIG. 1, for example, the electronic apparatus 1000 is illustrated as a smartphone as an example, but embodiments are not limited thereto.

A transmissive region TA may have a quadrangular shape having opposing sides parallel to each of a first direction DR1 and a second direction DR2. However, this is illustrated by way of example, and the transmissive region TA may have various shapes and is not limited to any one embodiment. That is, according to some example embodiments, the transmissive area TA may be circular, elliptical, triangular, or any other suitable shape according to the design of the electronic apparatus 1000.

A bezel region BZA is adjacent to the transmissive region TA. The bezel region BZA may surround the transmissive region TA. However, this is illustrated by way of example, and the bezel region BZA may be located adjacent to only one side of the transmissive region TA or may be omitted according to some example embodiments. The electronic apparatus according to some example embodiments of the inventive concept may include various shapes and sizes of the bezel region BZA and is not limited to any one embodiment.

A normal direction of a front surface of the electronic apparatus 1000 (i.e., a direction normal or perpendicular with respect to a display surface or front surface plane) may correspond to a thickness direction DR3 (hereinafter, referred to as a third direction DR3) of the electronic apparatus 1000. In this embodiment, a front surface (or a top surface) and a rear surface (or a bottom surface) of each member are defined in relation to a direction in which an image IM is displayed. The front surface and the rear surface are opposed to each other in the third direction DR3.

Meanwhile, directions indicated by the first to third directions DR1 to DR3 are relative and may be converted into other directions. Hereinafter, first to third directions are the directions indicated by the first to third directions DR1 to DR3, respectively, and refer to the same reference numerals.

The electronic apparatus 1000 may include a window 100, an electronic panel 200, an anti-reflection member POL, an adhesive layer ADL, a circuit board 300, an electronic module 400, and an outer case 500. The window 100 and the outer case 500 are combined to define the appearance of the electronic apparatus 1000.

The window 100 is located on the electronic panel 200 to cover a front surface IS of the electronic panel 200. The window 100 may include an optically transparent insulating material. For example, the window 100 may include glass or plastic. The window 100 may have a multilayer structure or a single layer structure. For example, the window 100 may have a laminated structure of a plurality of plastic films bonded by an adhesive, or may have a laminated structure of a glass substrate and a plastic film bonded by an adhesive.

The window 100 includes a front surface FS exposed to the outside. A front surface FS of the electronic apparatus 1000 may be defined substantially by the front surface FS of the window 100.

For example, the transmissive region TA may be an optically clear region. The transmissive region TA may have a shape corresponding to an active region AA. For example, the transmissive region TA overlaps the entirety of or at least a portion of the active region AA. The image IM displayed in the active region AA of the electronic panel 200 may be viewed from the outside through the transmissive region TA. The image IM may include a still image and a dynamic image.

The bezel region BZA may be a region having a lower light transmittance when compared with the transmissive region TA. The bezel region BZA defines the shape of the transmissive region TA. The bezel region BZA may be adjacent to and surround the transmissive region TA.

The bezel region BZA may have a color (e.g., a set or predetermined color). When the window 100 is provided as a glass or plastic substrate, the bezel region BZA may be a color layer printed or deposited on one surface of the glass or plastic substrate. Alternatively, the bezel region BZA may be formed by coloring a corresponding region of the glass or plastic substrate.

The bezel region BZA may cover a peripheral region NAA of the electronic panel 200 to block the peripheral region NAA from being viewed from the outside. Meanwhile, this is illustrated by way of example, and the bezel region BZA may be omitted in the window 100 according to some example embodiments of the inventive concept.

The electronic panel 200 may display the image IM. The electronic panel 200 includes the front surface IS including the active region AA and the peripheral region NAA. The active region AA may be a region that is activated according to an electrical signal.

In this embodiment, the active region AA may be a region where the image IM is displayed. The transmissive region TA overlaps at least the active region AA. Accordingly, a user may view the image IM through the transmissive region TA.

The peripheral region NAA may be a region covered by the bezel region BZA. The peripheral region NAA is adjacent to the active region AA. The peripheral region NAA may surround the active region AA. A drive circuit, drive wiring or the like for driving the active region AA may be located in the peripheral region NAA.

Various signal lines or pads PD for providing an electrical signal to the active region AA, an electronic device or the like may be located in the peripheral region NAA. The peripheral region NAA may be covered by the bezel region BZA and thus may not be viewed from the outside.

According to some example embodiments, the electronic panel 200 may be assembled in a flat state in which the active region AA and the peripheral region NAA face the window 100. However, this is illustrated as an example, and a portion of the peripheral region NAA of the electronic panel 200 may be bent. In this case, the portion of the peripheral region NAA faces the rear surface of the electronic apparatus 1000, so that the bezel region BZA on the front surface of the electronic apparatus 1000 may be reduced. Alternatively, the electronic panel 200 may be assembled in a state in which a portion of the active region AA is bent. Alternatively, the peripheral region NAA may be omitted in the electronic panel 200 according to some example embodiments of the inventive concept.

Referring to FIGS. 2 and 3, the electronic panel 200 may include a display unit DU and a sensing unit SU. The display unit DU may be a component that substantially generates the image IM. The image IM generated by the display unit DU is viewed from the outside by a user through the transmissive region TA. The sensing unit SU senses an user's input applied from the outside.

A hole region (e.g., a set or predetermined hole region) HA (or a first region HA) may be defined in the electronic panel 200. The hole region HA may have a higher light transmittance to the same area than the active region AA (or a second region AA). The hole region HA is defined at a position overlapping, when viewed in a plane, the electronic module 400 to be described later.

At least a portion of the hole region HA may be surrounded by the active region AA. According to some example embodiments, the hole region HA may be spaced apart from the peripheral region NAA (or a third region NAA). The hole region HA is illustrated to be defined inside the active region AA so that the active region AA surrounds the entirety of the edge of the hole region HA. In an assembled state of the electronic apparatus 1000 according to this embodiment, the hole region HA may be provided in the transmissive region TA and defined at a position spaced apart from the bezel region BZA.

Figure 4A:
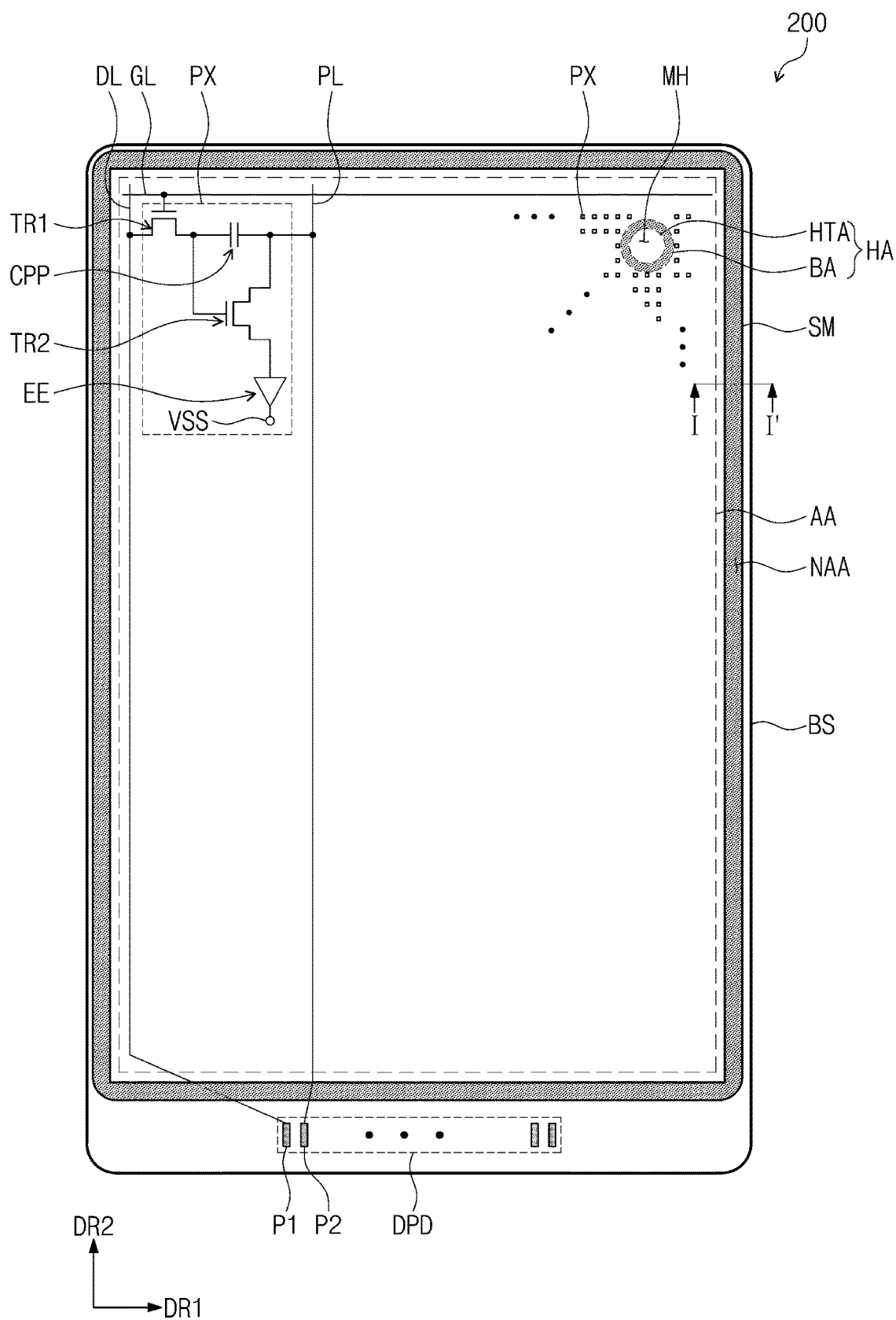
FIG. 4A is a plan view of an electronic panel according to some example embodiments of the inventive concept.

According to some example embodiments, the hole region HA may include a hole MH (refer to FIG. 4A) and a light shielding region BA (refer to FIG. 4A). The hole MH is located at the center of the hole region HA to penetrate the electric panel 200. The light shielding region BA may surround the edge of the hole MH. The light shielding region BA may be a region viewed in black from the outside. A more detailed description thereof will be given later.

The electronic panel 200 may include the hole MH defined in the hole region HA to penetrate the electronic panel 200. The hole MH may penetrate at least one of the display unit DU or the sensing unit SU. The edge of the hole region HA may be spaced apart substantially from the edge of the hole MH by a distance (e.g., a set or predetermined distance) to extend along the edge of the hole MH. The edge of the hole region HA may have a shape corresponding to the hole MH.

The anti-reflection layer POL may be locate between the window 100 and the electronic panel 200. The anti-reflection layer POL lowers reflectance of the electronic panel 200 for external light incident from the outside of the window 100. In this embodiment, the anti-reflection layer POL may include a polarizing film or a color filter.

An opening OP corresponding to the hole region HA may be defined in the anti-reflection layer POL according to some example embodiments. The opening OP overlaps the hole region HA when viewed in a plane and penetrates the anti-reflection layer POL.

The adhesive layer ADL is located between the anti-reflection layer POL and the window 100. The adhesive layer ADL bonds the anti-reflection layer POL and the window 100. When the anti-reflection layer POL according to some example embodiments of the inventive concept is a color filter formed on the electronic panel 200, the adhesive layer ADL may substantially bond the electronic panel 200 and the window 100. The adhesive layer ADL may include an optically clear adhesive, an optically clear resin, or a pressure sensitive adhesive, and is not limited to any one embodiment as long as the adhesive layer ADL is optically transparent.

The circuit board 300 may be connected to the electronic panel 200. The circuit board 300 may include a flexible board CF and a main board MB. The flexible board CF may include an insulating film and conductive wires mounted on the insulating film. The conductive wires are connected to the pads PD and electrically connect the circuit board 300 and the electronic panel 200.

According to some example embodiments, the flexible board CF may be assembled in a bent state. Thus, the main board MB may be located on a rear surface of the electronic panel 200 to be stably accommodated in a space the outer case 500 provides. On the other hand, the flexible board CF may be omitted in this embodiment, and in this case, the main board MB may be connected directly to the electronic panel 200.

The main board MB may include signal lines and electronic devices. The electronic devices may be connected to the signal lines and electrically connected to the electronic panel 200. The electronic devices generate various electrical signals, for example, a signal for generating the image IM or a signal for sensing the user's input, or process an electrical signal such as a sensed signal. Meanwhile, the main board MB may be provided in plurality in correspondence with the electrical signals for the main board MB to generate and process, and is not limited to any one embodiment.

Meanwhile, in the electronic apparatus 1000 according to some example embodiments of the inventive concept, the drive circuit for providing an electrical signal to the active region AA may be mounted directly on the electronic panel 200. In this case, the drive circuit may be mounted in the form of a chip or may be formed together with pixels PX (refer to FIG. 4A). At this time, the circuit board 300 may have a reduced area or may be omitted. The electronic apparatus 1000 according to some example embodiments of the inventive concept may include various embodiments and is not limited to any one embodiment.

The electronic module 400 is located below the window 100. The electronic module 400 may overlap the hole MH when viewed in a plane and overlap the hole region HA. The electronic module 400 may receive an external input transmitted through the hole region HA or provide an output through the hole region HA.

A receiving part for receiving an external input or an output part for providing an output, of the electronic module 400, may overlap the hole region HA when viewed in a plane (i.e., when viewed in a plan view). The electronic module 400 may be located on the rear surface of the electronic panel 200, or at least a portion of the electronic module 400 may be located inside the hole MH of the electronic panel 200. According to some example embodiments of the inventive concept, the electronic module 400 is arranged to overlap the active region AA, and thus the bezel region BZA may have a relatively reduced size (or footprint).

Referring to FIG. 3, the electronic apparatus 1000 may include the electronic panel 200, a power supply module PM, a first electronic module EM1, and a second electronic module EM2. The electronic panel 200, the power supply module PM, the first electronic module EM1, and the second electronic module EM2 may be electrically connected to each other. FIG. 2 illustrates an example of the display unit DU and the sensing unit SU components of the electronic panel 200.

The first electronic module EM1 and the second electronic module EM2 include a variety of functional modules for operating the electronic apparatus 1000. The first electronic module EM1 may be mounted directly on a motherboard electrically connected to the electronic panel 200, or may be mounted on a separate board to be electrically connected to the motherboard through a connector or the like.

The first electronic module EM1 may include a control module CM, a wireless communication module TM, an image input module IIM, a sound input module AIM, a memory MM, and an external interface IF. Some of the modules described above may not be mounted on the motherboard, but may be electrically connected to the motherboard through a flexible circuit board.

The control module CM controls the overall operation of the electronic apparatus 1000. The control module CM may be a microprocessor. For example, the control module CM activates or deactivates the electronic panel 200. The control module CM may control other modules such as the image input module IIM and the sound input module AIM on the basis of a touch signal received from the electronic panel 200.

The wireless communication module TM may transmit/receive a radio signal to/from another terminal by using a Bluetooth or Wi-Fi channel. The wireless communication module TM may transmit/receive a voice signal using a general communication channel. The wireless communication module TM includes a transmitting part TM1 for modulating and transmitting a signal to be transmitted, and a receiving part TM2 for demodulating a received signal.

The image input module IIM processes an image signal to convert the processed image signal into image data that may be displayed on the electronic panel 200. The sound input module AIM receives an external sound signal using a microphone in a recording mode, a voice recognition mode, or the like, and converts the received external sound signal into electrical voice data.

The external interface IF serves as an interface to which an external charger, a wired/wireless data port, a card socket (e.g., a memory card and a SIM/UIM card), or the like is connected.

The second electronic module EM2 may include a sound output module AOM, a light emitting module LM, a light receiving module LRM, a camera module CMM, or the like. The components described above may be mounted directly on the motherboard, or mounted on a separate board to be electrically connected to the electronic panel 200 or the first electronic module EM1 via a connector or the like.

The sound output module AOM converts sound data received from the wireless communication module TM or sound data stored in the memory MM and outputs the converted sound data to the outside.

The light emitting module LM generates and outputs light. The light emitting module LM may output infrared rays. For example, the light emitting module LM may include an LED device. For example, the light receiving module LRM may detect infrared rays. The light receiving module LRM may be activated when infrared rays having a level or higher (e.g., a set or predetermined level or higher) are detected. The light receiving module LRM may include a CMOS sensor. After infrared rays generated by the light emitting module LM are outputted, the infrared rays may be reflected by an external subject (e.g., a user's finger or face) and the reflected infrared rays may be incident on the light receiving module LRM. The camera module CMM captures an external image.

The electronic module 400 according to some example embodiments of the inventive concept may include at least one of the components of the first electronic module EM1 or the second electronic module EM2. For example, the electronic module 400 may include at least one of a camera, a speaker, a light sensor, or a heat sensor. The electronic module 400 may detect an external subject through the hole region HA or provide a sound signal such as a voice to the outside through the hole region HA. In addition, the electronic module 400 may include a plurality of components among the components of the first electronic module EM1 and the second electronic module EM2 and is not limited to any one embodiment.

The electronic module 400 arranged to overlap the hole region HA, through the hole region HA, may easily view an external subject or may easily transmit an output signal generated thereby to the outside. According to some example embodiments, meanwhile, a transparent member located between the electronic module 400 and the electronic panel 200 may further be included in the electronic apparatus 1000 according to some example embodiments of the inventive concept. The transparent member may be an optically clear film so that an external input transmitted through the hole MH (refer to FIG. 4A) of the electronic panel 200 is transmitted to the electronic module 400 through the transparent member. The transparent member may be attached to the rear surface of the electronic panel 200, or may be located between the electronic panel 200 and the electronic module 400 without a separate adhesive layer. The electronic apparatus 1000 according to some example embodiments of the inventive concept may have various structures and is not limited to any one embodiment.

According to some example embodiments of the inventive concept, the electronic module 400 may be assembled to overlap the transmissive region TA when viewed in a plane. Accordingly, the expansion of the bezel region BZA due to accommodation of the electronic module 400 may be prevented, thereby improving the aesthetics of the electronic apparatus 1000.

Figure 4B:
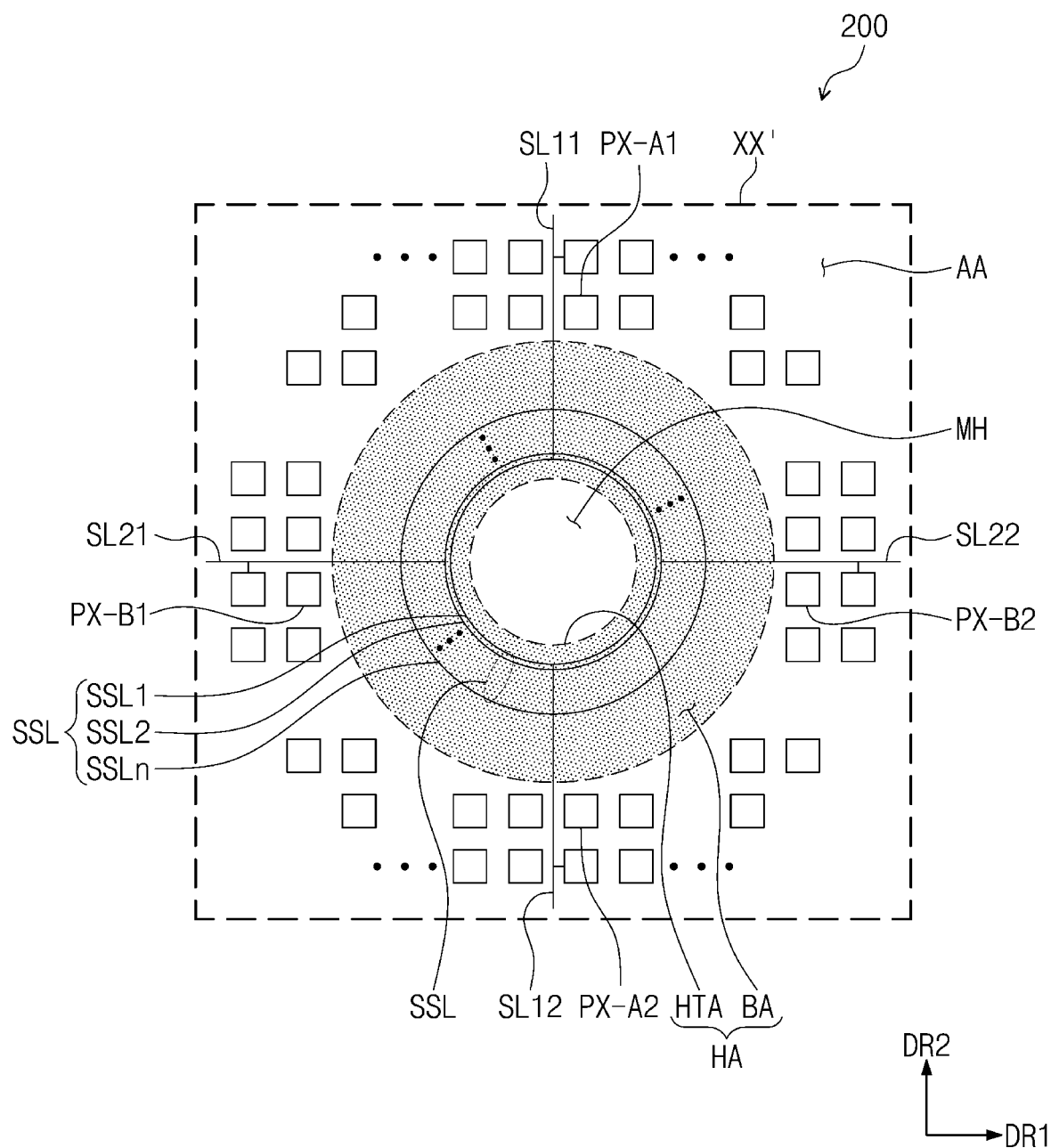
FIG. 4B is a plan view of a region XX' illustrated in FIG. 2.

FIG. 4A is a plan view of the electronic panel according to some example embodiments of the inventive concept. FIG. 4B is a plan view of a region XX' illustrated in FIG. 2. FIG. 4A illustrates, for ease of description, an example plan view of the electronic panel 200 including the display unit DU (see FIG. 3), FIG. 4B illustrates an example schematic plan view of the electronic panel 200 in a region adjacent to the hole region HA, although not all components necessarily illustrated in FIGS. 4A and 4B. Hereinafter, further details of some example embodiments of the inventive concept will be described with reference to FIGS. 4A and 4B.

The electronic panel 200 includes a base substrate BS, a plurality of pixels PX, a plurality of signal lines GL, DL, and PL, a sealing member SM, and a plurality of display pads DPD.

The active region AA and the peripheral region NAA may be regions provided by the base substrate BS. The base substrate BS may include an insulating substrate. For example, the base substrate BS may be formed of a glass substrate, a plastic substrate, or a combination thereof. Alternatively, the base substrate BS may include a metal substrate.

The base substrate BS may be provided as being flexible so as to be folded by a user, or may be provided as being rigid so that there is no shape change. In this embodiment, a rigid base substrate BS formed of a glass material is illustrated by way of example. The base substrate BS according to some example embodiments of the inventive concept may include various embodiments as long as components such as the pixels PX and the signal lines GL, DL, and PL may be arranged on the base substrate BS, and is not limited to any one embodiment.

The signal lines GL, DL, and PL are connected to the pixels PX to transmit electrical signals to the pixels PX. Examples of a scan line GL, a data line DL, and a power line PL are illustrated among the signal lines included in the electronic panel 200. However, this is illustrated by way of example, and the signal lines GL, DL, and PL may further include at least one of an initialization voltage line or a light emission control line and are not limited to any one embodiment. The scan line GL, the data line DL, and the power line PL may be provided in plurality.

The pixels PX may be arranged in the active region AA. Each of the pixels PX is illustrated in a quadrangular shape, and may substantially correspond to a light emitting region where light is emitted by a light emitting device EE to be described later. FIG. 4A illustrates an example of an enlarged signal circuit diagram of one pixel PX of the plurality of pixels PX. The pixel PX may include a first thin film transistor TR1, a capacitor CPP, a second thin film transistor TR2, and the light emitting device EE.

The first thin film transistor TR1 is connected to the scan line GL and the data line DL. The capacitor CPP is connected to the first thin film transistor TR1 and the power line PL. The second thin film transistor TR2 is connected to the first thin film transistor TR1, the capacitor CPP, and the light emitting device EE. The first thin film transistor TR1, the capacitor CPP, and the second thin film transistor TR2 may control the operation of the light emitting device EE.

The light emitting device EE may emit light at a time and intensity corresponding to a data signal transmitted through the data line DL. For example, the light emitting device EE includes an organic light emitting layer or an inorganic light emitting layer. For example, the light emitting device EE may include an organic light emitting device, a quantum dot light emitting device, a nano LED, a micro LED, an electrophoretic device, or an electro-wetting device.

The light emitting device EE is connected to a power supply terminal VSS to receive a power signal (hereinafter, referred to as a second power signal) different from a power signal (hereinafter, referred to as a first power signal) provided to the power line PL. The light emitting device EE may generate light corresponding to a difference between an electrical signal provided from the second thin film transistor TR2 and the second power signal. Meanwhile, this is illustrated by way of example, and each of the pixels PX may include electronic devices having various configurations and arrangements and is not limited to any one embodiment.

Referring to FIGS. 4A and 4B, the pixels PX are arranged around the hole region HA. According to some example embodiments, the hole region HA may be defined as being surrounded by the active region AA. In this embodiment, the edge (boundary) of the hole region HA is dotted, and is illustrated in a circular shape by way of example.

FIG. 4B illustrates some signal wires SL11, SL12, SL21, SL22, and SSL located adjacent to the hole region HA. The signal wires SL11, SL12, SL21, SL22, and SSL may include main signal wires SL11, SL12, SL21, and SL22, and sub signal wires SSL. The main signal wires SL11, SL12, SL21, and SL22 are located in the active region AA and connected to corresponding pixels of the pixels PX. The main signal wires SL11, SL12, SL21, and SL22 may include first to fourth main signal wires SL11, SL12, SL21, and SL22.

The first main signal wire SL11 may be a data line providing a data signal to a first pixel PX-A1 of the pixels PX, and the second main signal wire SL12 may be a data line providing a data signal to a second pixel PX-A2 of the pixels PX. The third main signal wire SL21 may be a scan line providing a scan signal to a third pixel PX-B1 of the pixels PX, and the fourth main signal wire SL22 may be a scan line providing a scan signal to a fourth pixel PX-B2 of the pixels PX.

According to some example embodiments, the first pixel PX-A1 and the second pixel PX-A2 may be pixels that are spaced apart from each other with the hole region HA therebetween and located in the same column. The third pixel PX-B1 and the fourth pixel PX-B2 may be pixels that are spaced apart from each other with the hole region HA therebetween and located in the same row.

According to some example embodiments, meanwhile, the light emission control line for transmitting a light emission control signal to the pixel or the initialization voltage line for providing an initialization voltage to the pixel may further be included in the main signal wires SL11, SL12, SL21, and SL22. The main signal wires may include various embodiments as long as the main signal wires are respectively connected to corresponding ones of the pixels PX arranged in the active region AA to provide an electrical signal for controlling the corresponding ones of the pixels PX, and are not limited to any one embodiment.

The hole region HA may include the hole transmissive region HTA and the light shielding region BA. The hole transmissive region HTA may be defined as a region in which the hole MH is formed. The hole transmissive region HTA may be a region that is optically transparent and has a transmittance of about 90% or greater. External light provided to the electronic module 400 (see FIG. 2) or light outputted from the electronic module 400 is transmitted through the hole transmissive region HTA.

The light shielding region BA is adjacent to the hole transmissive region HTA. The light shielding region BA may be defined along the edge of the hole transmissive region HTA, and in this embodiment, the light shielding region BA may be provided in a ring shape surrounding the hole transmissive region HTA.

The light shielding region BA may be optically opaque. For example, the light shielding region BA may be a region having a transmittance of about 5% or less. The light shielding region BA may be viewed in a color having low brightness, for example, in a color of black, gray, brown, or the like.

The sub signal wires SSL are located in the hole region HA. For example, the sub signal wires SSL are located in the light shielding region BA. The sub signal wires SSL may be spaced apart from a hole transmissive region HTA when viewed in a plane and may extend along the edge of the hole transmissive region HTA.

The sub signal wires SSL may be arranged to be spaced apart from each other in the hole region HA. The sub signal wires SSL may transmit signals independent of each other. The sub signal wires SSL may include, for example, at least one of a wire for transmitting a scan signal, a wire for transmitting a data signal, a wire for transmitting an initialization voltage, a wire for transmitting a light emission control signal, or a wire for transmitting a power supply voltage.

The sub signal wires SSL may include n number of wires sequentially arranged to be spaced apart from the hole MH. FIG. 4B illustrates, for ease of description, an example of a first sub signal wire SSL1 located closest to the hole MH, a second sub signal wire SSL2 surrounding the first sub signal wire SSL1, and an nth sub signal wire SSLn located farthest from the hole MH.

The sub signal wires SSL may be electrically connected to the main signal wires SL11, SL12, SL21, and SL22 connected to the pixels located adjacent to the hole region HA. The first sub signal wire SSL1 connects the first main signal wire SL11 and the second main signal wire SL12 so that the same electrical signal is transmitted to the first main signal wire SL11 and the second main signal wire SL12. The second sub signal wire SSL2 connects the third main signal wire SL21 and the fourth main signal wire SL22 so that the same electrical signal is transmitted to the third main signal wire SL21 and the fourth main signal wire SL22.

In this embodiment, each of the sub signal wires SSL is illustrated as having a closed circular shape. This is illustrated as one example, however, and each of the sub signal wires SSL may have an open curved shape as long as each of the sub signal wires SSL may be connected to corresponding ones of the main signal wires SL11, SL12, SL21, and SL22, and is not limited to any one embodiment.

In addition, the sub signal wires SSL may be formed in an integral shape on a layer the same as that of the main signal wires SL11, SL12, SL21, and SL22, or may be located on a different layer to be connected to the main signal wires SL11, SL12, SL21, and SL22 through a contact hole (e.g., a set or predetermined contact hole), and are not limited to any one embodiment.

According to some example embodiments of the inventive concept, the first main signal wire SL11 and the second main signal wire SL12 are connected to each other through the first sub signal wire SSL1, and thus a common electrical signal may be provided to the first and second pixels PX-A1 and PX-A2 that are spaced apart from each other with the hole region HA therebetween and constitute the same column. Similarly, the third main signal wire SL21 and the fourth main signal wire SL22 are connected through the nth sub signal wire SSLn, and thus a common electrical signal may be provided to the third and fourth pixels PX-B1 and PX-B2 that are spaced apart from each other with the hole region HA therebetween and constitute the same row. Accordingly, an electrical signal may be stably provided, without disconnection of the signal lines, to a plurality of pixels PX spaced apart from each other with the hole region HA therebetween.

Referring back to FIG. 4A, the display pads DPD may include a first pad P1 and a second pad P2. The first pad P1 may be provided in plurality and the plurality of first pads P1 may be respectively connected to the data lines DL. The second pad P2 may be electrically connected to the power line PL. The electronic panel 200 may provide the pixels PX with electrical signals provided from the outside through the display pads DPD. Meanwhile, the display pads DPD may further include pads for receiving other electrical signals in addition to the first pad P1 and the second pad P2, and are not limited to any one embodiment.

The sealing member SM is spaced apart from the pixels PX and located in the peripheral region NAA. The sealing member SM may have a closed curve shape surrounding the edge of the active region AA when viewed in a plane. The sealing member SM seals the pixels PX and protects the pixels PX from external contaminants or moisture. The sealing member SM may have light shielding properties. A detailed description thereof will be given later.

The electronic panel 200 according to some example embodiments of the inventive concept provides the light shielding region BA in the hole region HA. The light shielding region BA may overlap the sub signal wires SSL located around the hole transmissive region HTA, thereby preventing the sub signal wires SSL from being viewed from the outside. Accordingly, the aesthetics of the electronic panel 200 may be improved.

Figure 5:
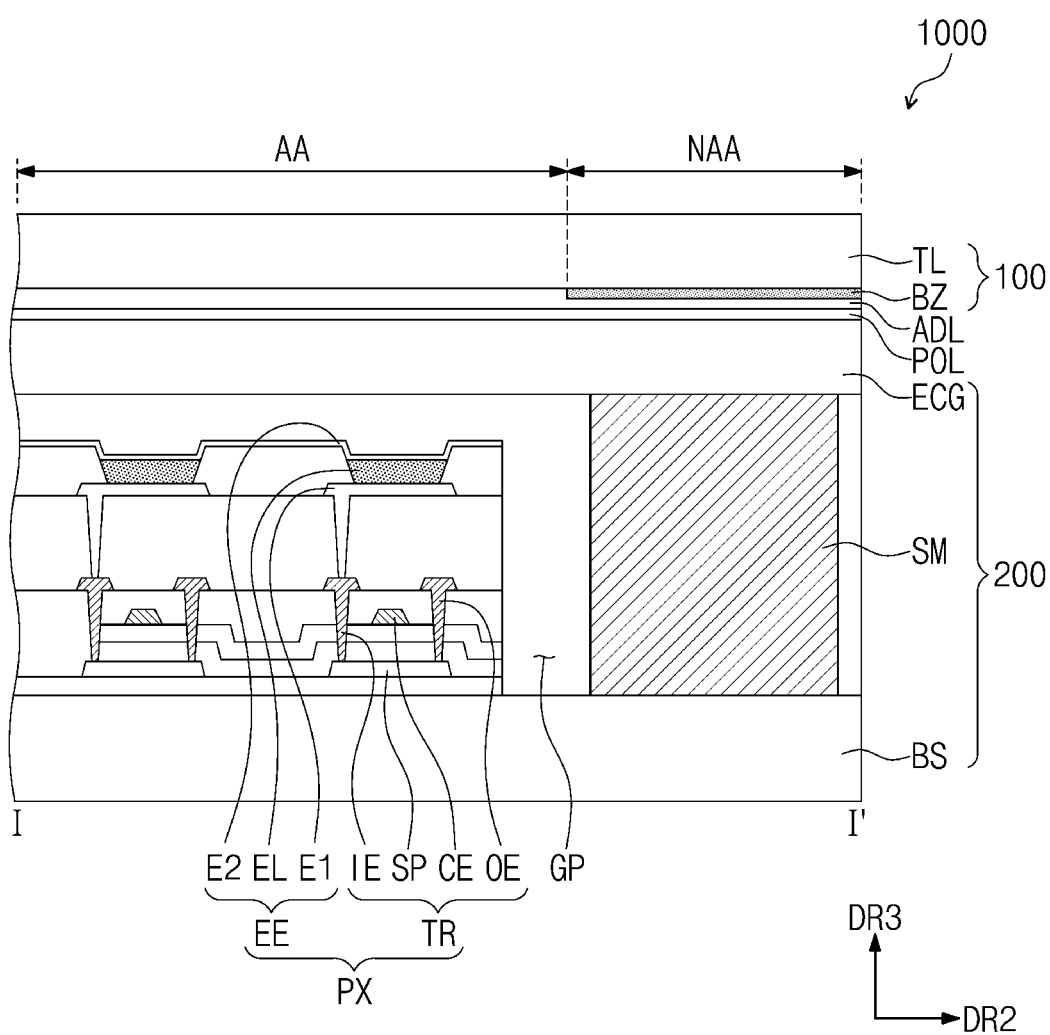
FIG. 5 is a cross-sectional view taken along the line I-I' illustrated in FIG. 4A.
Figure 6A:
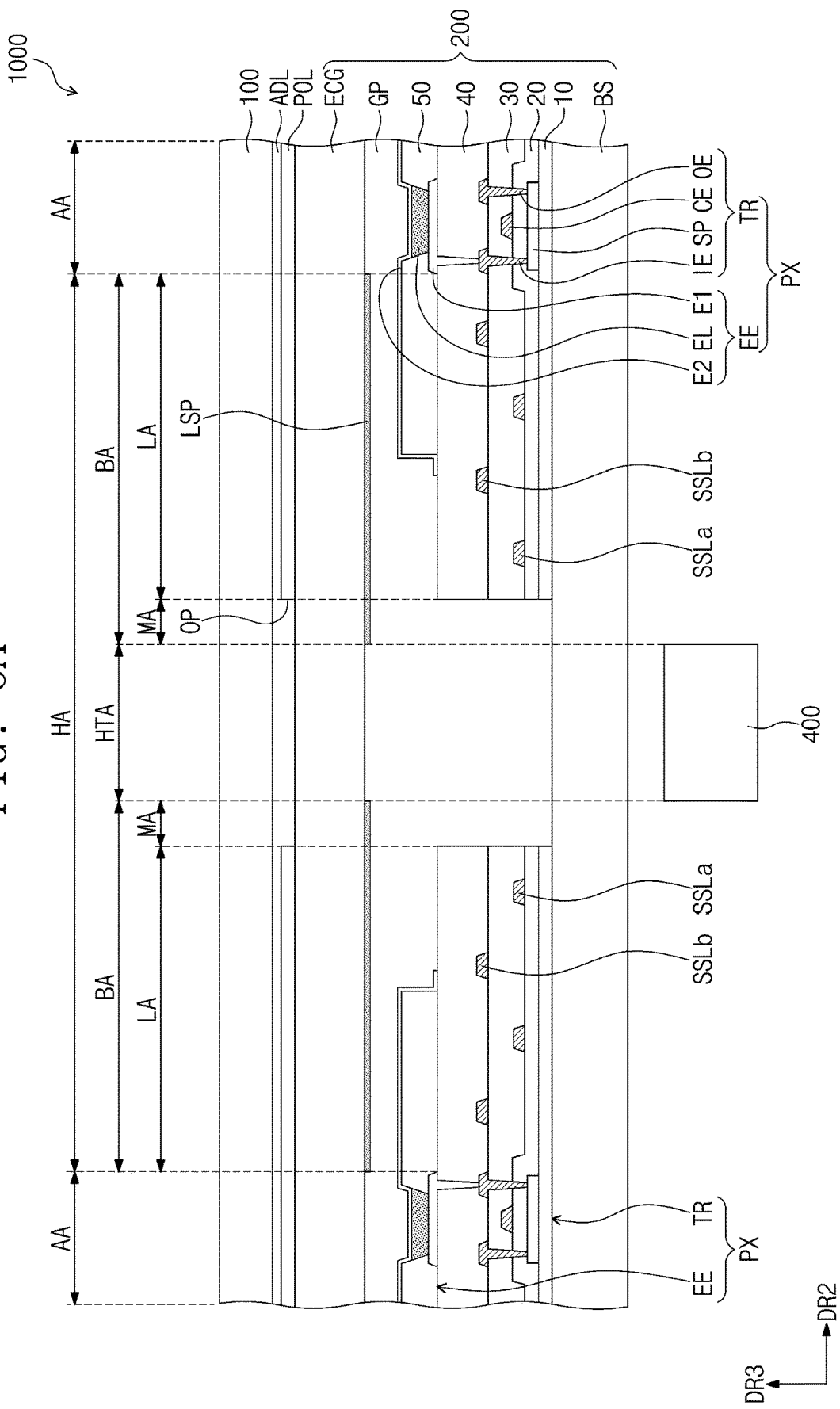
FIG. 6A is a cross-sectional view of the electronic apparatus according to some example embodiments of the inventive concept.
Figure 6B:
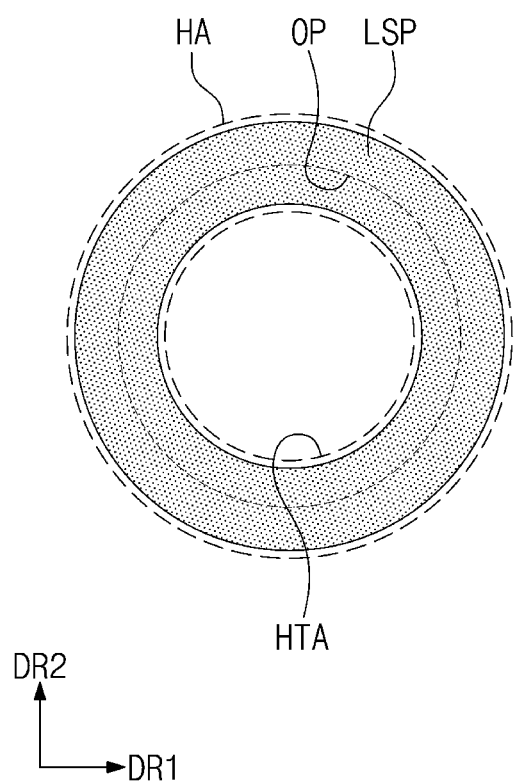
FIG. 6B is a plan view illustrating a portion of the electronic apparatus according to some example embodiments of the inventive concept.

FIG. 5 is a cross-sectional view taken along the line I-I' illustrated in FIG. 4A. FIG. 6A is a cross-sectional view of the electronic apparatus according to some example embodiments of the inventive concept. FIG. 6B is a plan view illustrating a portion of the electronic apparatus according to some example embodiments of the inventive concept.

FIG. 5 illustrates cross sections of the window 100, the electronic panel 200, the anti-reflection layer POL, and the adhesive layer ADL among the components of the electronic apparatus 1000. For ease of description, FIG. 6A schematically illustrates a cross-sectional view of the electronic apparatus 1000 in the hole region HA, and FIG. 6B schematically illustrates a plan view of some components in the hole region HA. Hereinafter, further details of some example embodiments of the inventive concept will be described with reference to FIGS. 5 to 6B. In the meantime, components the same as the components described with reference to FIGS. 1 to 4B are denoted by the same reference numerals, and some duplicate description thereof may not be given.

The electronic panel 200 may include the base substrate BS, the pixel PX, the sealing member SM, and an encapsulation substrate ECG. FIG. 5 illustrates, for ease of description, one thin film transistor TR of the thin film transistors and the light emitting device EE, among the pixel PX. The thin film transistor TR may correspond to the second thin film transistor TR2 (see FIG. 4A) illustrated in FIG. 4A.

A plurality of insulating layers 10, 20, 30, 40, and 50 are located on the base substrate BS. The insulating layers 10, 20, 30, 40, and 50 may include first to fifth insulating layers 10, 20, 30, 40, and 50 sequentially laminated. Meanwhile, each of the first to fifth insulating layers 10, 20, 30, 40, and 50 may include an organic material and/or an inorganic material, and may have a single layer structure or a laminated structure.

The first insulating layer 10 is located on the base substrate BS to cover a front surface of the base substrate BS. The first insulating layer 10 prevents oxygen or moisture flowing in through the base substrate BS from permeating the pixel PX, or provides the pixel PX with a top surface having surface energy lower than surface energy of the base substrate BS so that the pixel PX is stably formed.

The thin film transistor TR is located on the first insulating layer 10. The thin film transistor TR includes a semiconductor pattern SP, a control electrode CE, an input electrode IE, and an output electrode OE. The semiconductor pattern SP is located on the first insulating layer 10. The semiconductor pattern SP may include a semiconductor material.

The control electrode CE is spaced apart from the semiconductor pattern SP with the second insulating layer 20 therebetween. The control electrode CE may be connected to one electrode of the first thin film transistor TR1 (see FIG. 4A) and one electrode of the capacitor CPP (see FIG. 4A) described above. The input electrode IE and the output electrode OE are located on the third insulating layer 30 and spaced apart from each other when viewed in a plane. The input electrode IE and the output electrode OE pass through the second insulating layer 20 and the third insulating layer 30 to be respectively connected to one side and the other side of the semiconductor pattern SP.

On the other hand, this is illustrated by way of example, and in the thin film transistor TR according to some example embodiments of the inventive concept, the input electrode IE and the output electrode OE may be formed from portions of the semiconductor pattern SP. For example, a region of the semiconductor pattern SP overlapping the control electrode CE may be defined as a channel region, a portion extending from one side of the channel region may be defined as the input electrode IE, and a portion extending from the other side of the channel region may be defined as the output electrode OE. Alternatively, the input electrode IE and the output electrode OE may be located directly on a top surface of the semiconductor pattern SP or may be located below the semiconductor pattern SP. The thin film transistor TR according to some example embodiments of the inventive concept may be formed in various structures, and is not limited to any one embodiment.

The light emitting device EE is located on the fourth insulating layer 40. The light emitting device EE includes a first electrode E1, a light emitting layer EL, and a second electrode E2.

The first electrode E1 may be connected to the thin film transistor TR through the fourth insulating layer 40. According to some example embodiments, meanwhile, a separate connection electrode located between the first electrode E1 and the thin film transistor TR may further be included in the electronic panel 200, and in this case, the first electrode E1 may be electrically connected to the thin film transistor TR through the connection electrode.

The fifth insulating layer 50 is located on the fourth insulating layer 40. The fifth insulating layer 50 may include an organic material and/or an inorganic material, and may have a single layer structure or a laminated structure. An opening may be defined in the fifth insulating layer 50. The opening exposes at least a portion of the first electrode E1. The fifth insulating layer 50 may be a pixel defining film.

The light emitting layer EL is located between the first electrode E1 and the second electrode E2. The light emitting layer EL includes a light emitting material. For example, the light emitting layer EL may be formed of at least one of materials that emit red, green, and blue light, and may include a fluorescent material or a phosphorescent material. The light emitting layer EL may include an organic light emitting material or an inorganic light emitting material. The light emitting layer EL may emit light in response to a potential difference between the first electrode E1 and the second electrode E2.

According to some example embodiments, meanwhile, a charge control layer located between the light emitting layer EL and the first electrode E1 or between the light emitting layer EL and the second electrode E2 may further be included in the light emitting device EE. The charge control layer may include at least one of a hole transport material, a hole injection material, an electron transport material, or an electron injection material.

The second electrode E2 is located on the light emitting layer EL. The second electrode E2 may face the first electrode E1. The second electrode E2 may have an integral shape extending from the active region AA to the peripheral region NAA. The second electrode E2 may be provided in common to the plurality of pixels. The light emitting device EE located in each of the pixels receives a common power supply voltage (hereinafter, referred to as a second power supply voltage) through the second electrode E2.

The second electrode E2 may include a transmissive conductive material or a transflective conductive material. Accordingly, light generated in the light emitting layer EL may be easily emitted in the third direction DR3 through the second electrode E2. However, this is illustrated by way of example, and the light emitting device EE according to some example embodiments of the inventive concept may be driven, according to a design thereof, in a bottom emission method in which the first electrode E1 includes a transmissive material or a transflective material, or in a double-sided emission method in which light is emitted toward both a front surface and a rear surface, and is not limited to any one embodiment.

The encapsulation substrate ECG is located on the base substrate BS to cover the pixel PX and the insulating layers 10, 20, 30, 40, and 50. The encapsulation substrate ECG may be located to be spaced apart from the pixel PX and the insulating layers 10, 20, 30, 40, and 50 when viewed in a cross section. The encapsulation substrate ECG may be an insulating and optically clear substrate. For example, the encapsulation substrate ECG may include a glass substrate or a plastic substrate.

The sealing member SM is located between the encapsulation substrate ECG and the base substrate BS. The sealing member SM allows the encapsulation substrate ECG and the base substrate BS to be coupled together with a space (e.g., a set or predetermined space) GP therebetween. The space GP (hereinafter, referred to as a gap GP) between the encapsulation substrate ECG and the base substrate BS may be filled with air or an inert gas.

The sealing member SM may include frit. The sealing member SM may be formed by sintering frit. The sealing member SM may be optically opaque. The sealing member SM may include a vanadium oxide (V2O4, V2O5). The sealing member SM may have a color having low brightness, and thus the sealing member SM may be viewed, for example, in a color such as black, brown, and gray.

However, this is described by way of example, and the sealing member SM may be optically clear or may be viewed in a color having high brightness, and is not limited to any one embodiment.

The anti-reflection layer POL is located on the electronic panel 200. The anti-reflection layer POL may directly come in contact with a top surface of the electronic panel 200 or may be bonded to the electronic panel 200 by an adhesive layer. The anti-reflection layer POL may include an optical film, and may include, for example, a polarizing film.

The adhesive layer ADL bonds the window 100 and the anti-reflection layer POL. The window 100 may include a transmissive part TL and a bezel part BZ. The transmissive part TL may be provided as being optically transparent and may include a transparent insulating material.

As described above, the bezel part BZ may be a color layer printed or deposited on a rear surface of the transmissive part TL. Alternatively, the bezel part BZ may be formed by coloring a corresponding region of the transmissive part TL, and in this case, a step between the bezel part BZ and the transmissive part TL may be removed. The window 100 according to some example embodiments of the inventive concept may be provided in various embodiments and is not limited to any one embodiment.

In the electronic apparatus according to some example embodiments of the inventive concept, the sealing member SM may be covered by the bezel part BZ and thus may not be viewed from the outside. The bezel part BZ may prevent the peripheral region NAA from being viewed from the outside. Alternatively, in the electronic apparatus according to some example embodiments of the inventive concept, the bezel part BZ may be omitted. In this case, the sealing member SM may be optically opaque, the peripheral region NAA and the active region AA may be divided by the sealing member SM. The electronic apparatus according to some example embodiments of the inventive concept may include various embodiments and is not limited to any one embodiment.

FIG. 6A illustrates a cross-sectional view of the electronic apparatus 1000 in the hole region HA. The hole region HA includes the hole transmissive region HTA and the light shielding region BA. The light shielding region BA may include a wiring region LA and a margin region MA.

The wiring region LA may be a region, in the hole region HA, in which signal wires SSLa and SSLb are located. The signal wires SSLa and SSLb may correspond to the sub signal wires SSL (see FIG. 4B) described above. In this embodiment, the signal wires SSLa and SSLb are illustrated to include first signal wires SSLa and second signal wires SSLb located on different layers. However, this is illustrated by way of example, and the signal wires SSLa and SSLb may be located to be spaced apart from each other on the same layer, and are not limited to any one embodiment.

The margin region MA may be defined between the hole transmissive region HTA and the wiring region LA. In this embodiment, the hole transmissive region HTA may be defined as a region overlapping the electronic module 400 when viewed in a plane, in particular, as a region overlapping a portion of the electronic module 400 where light input/output occurs, for example, the lens or barrel of a camera.

The components of the electronic panel 200 except for the base substrate BS and the encapsulation substrate ECG may be non-overlapping with the hole transmissive region HTA when viewed in a plane. For example, ends of the insulating layers 10, 20, 30, 40, and 50, which are closer to the hole transmissive region HTA, are formed to be spaced apart from the hole transmissive region HTA. According to some example embodiments of the inventive concept, the insulating layers 10, 20, 30, 40, and 50, or the signal wires SSLa and SSLb having relatively low light transmittance may be located to be spaced apart from the hole transmissive region HTA, thereby improving light transmittance of the hole transmissive region HTA.

The opening OP of the anti-reflection layer POL is defined by penetrating a region of the anti-reflection layer POL overlapping the hole transmissive region HTA. An inner surface of the opening OP may be formed at a position spaced apart from the hole transmissive region HTA when viewed in a plane.

According to some example embodiments of the inventive concept, optically clear components, for example, the base substrate BS, the encapsulation substrate ECG, the adhesive layer ADL, and the window 100 may be arranged to overlap the hole transmissive region HTA, and the insulating layers 10, 20, 30, 40, and 50, or the signal wires SSLa and SSLb having relatively low light transmittance may be removed from the hole transmissive region HTA, thereby improving light transmittance of the hole transmissive region HTA and the sensitivity of the electronic module 400.

The margin region MA may be a region generated by tolerance occurring when the opening OP of the anti-reflection layer POL is formed, or by the manufacturing tolerance of the insulating layers 10, 20, 30, 40, and 50. The margin region MA may be a region between the inner surface of the opening OP of the anti-reflection layer POL and the hole transmissive region HTA or a region between the ends of the insulating layers 10, 20, 30, 40, and 50 and the hole transmissive region HTA.

The size of the margin region MA may increase as tolerance becomes larger occurring when the insulating layers 10, 20, 30, 40, and 50, or the anti-reflection layer POL is formed. The margin region MA may be omitted in the case that tolerance is zero when the insulating layers 10, 20, 30, 40, and 50, or the anti-reflection layer POL is formed.

The electronic panel 200 according to some example embodiments of the inventive concept may further include a light shielding pattern LSP. The light shielding pattern LSP may be located on a rear surface of the encapsulation substrate ECG. The light shielding pattern LSP may directly come in contact with the rear surface of the encapsulation substrate ECG. The light shielding pattern LSP may be formed by printing with or depositing a light shielding material on the rear surface of the encapsulation substrate ECG.

The light shielding pattern LSP makes the light shielding region BA optically opaque. The light shielding pattern LSP may have a color having low brightness, for example, a color such as black, gray, and brown.

In this embodiment, the light shielding pattern LSP may include frit. The light shielding pattern LSP may be formed by printing the same with frit having an optically opaque color, for example, vanadium-based frit on the rear surface of the encapsulation substrate ECG.

In this case, when the sealing member SM (refer to FIG. 5) is optically opaque, the light shielding pattern LSP may be formed of a material the same as that of the sealing member SM. After printing with frit is performed, through a single process, in regions of the rear surface of the encapsulation substrate ECG corresponding to the hole region HA and the peripheral region NAA (refer to FIG. 5), the sealing member SM may be formed by irradiating the region corresponding to the peripheral region NAA with laser light, and the light shielding pattern LSP may be formed by omitting laser irradiation in the region corresponding to the hole region HA. Accordingly, by forming the light shielding pattern LSP during the process of forming the sealing member SM and by forming the light shielding pattern LSP using a material the same as that of the sealing member SM, a current process may be used without change, and thus a process may be simplified and process cost may be reduced for the light shielding pattern LSP.

Referring to FIGS. 5, 6A and 6B, the light shielding pattern LSP is located inside the hole region HA and has a ring shape surrounding the hole transmissive region HTA. The opening OP of the anti-reflection layer POL is illustrated in a circular shape surrounding the hole transmissive region HTA. As described above, depending on the degree of tolerance in forming the opening OP, the opening OP may be formed to be the same as the hole transmissive region HTA, or formed to be larger than the hole transmissive region HTA as the inner surface of the opening OP is farther from the hole transmissive region HTA.

Meanwhile, even when the size of the opening OP varies depending on the degree of tolerance, the inner surface of the opening OP is defined in the light shielding region BA opaquely viewed due to the light shielding pattern LSP. The light shielding region BA may function substantially as a bezel in the hole region HA.

According to some example embodiments of the inventive concept, a defect that the inner surface of the opening OP is viewed depending on the degree of tolerance may be prevented, and the electronic apparatus 1000 may provide a uniform color in the light shielding region BA regardless of the degree of tolerance of the anti-reflection layer POL. Accordingly, design freedom of the anti-reflection layer POL may be secured and the aesthetics of the electronic apparatus 1000 may be improved.

In addition, in a region overlapping the hole region HA and a region overlapping the active region AA in the window 100 according to some example embodiments of the inventive concept, only the transmissive part TL is provided and the bezel part BZ is not provided. That is, for the window 100, the light transmittance of the region overlapping the hole region HA may be substantially the same as the light transmittance of the region overlapping the active region AA. In the electronic apparatus 1000, light shielding properties in the hole region HA may be provided by the light shielding pattern LSP located in the electronic panel 200 rather than the window 100. Accordingly, the possibility of misalignment between the hole transmissive region HTA and the light shielding region BA or between the hole transmissive region HTA and the light shielding pattern LSP may be alleviated, so that a corresponding process may be simplified and corresponding process cost may be reduced.

Figure 7:
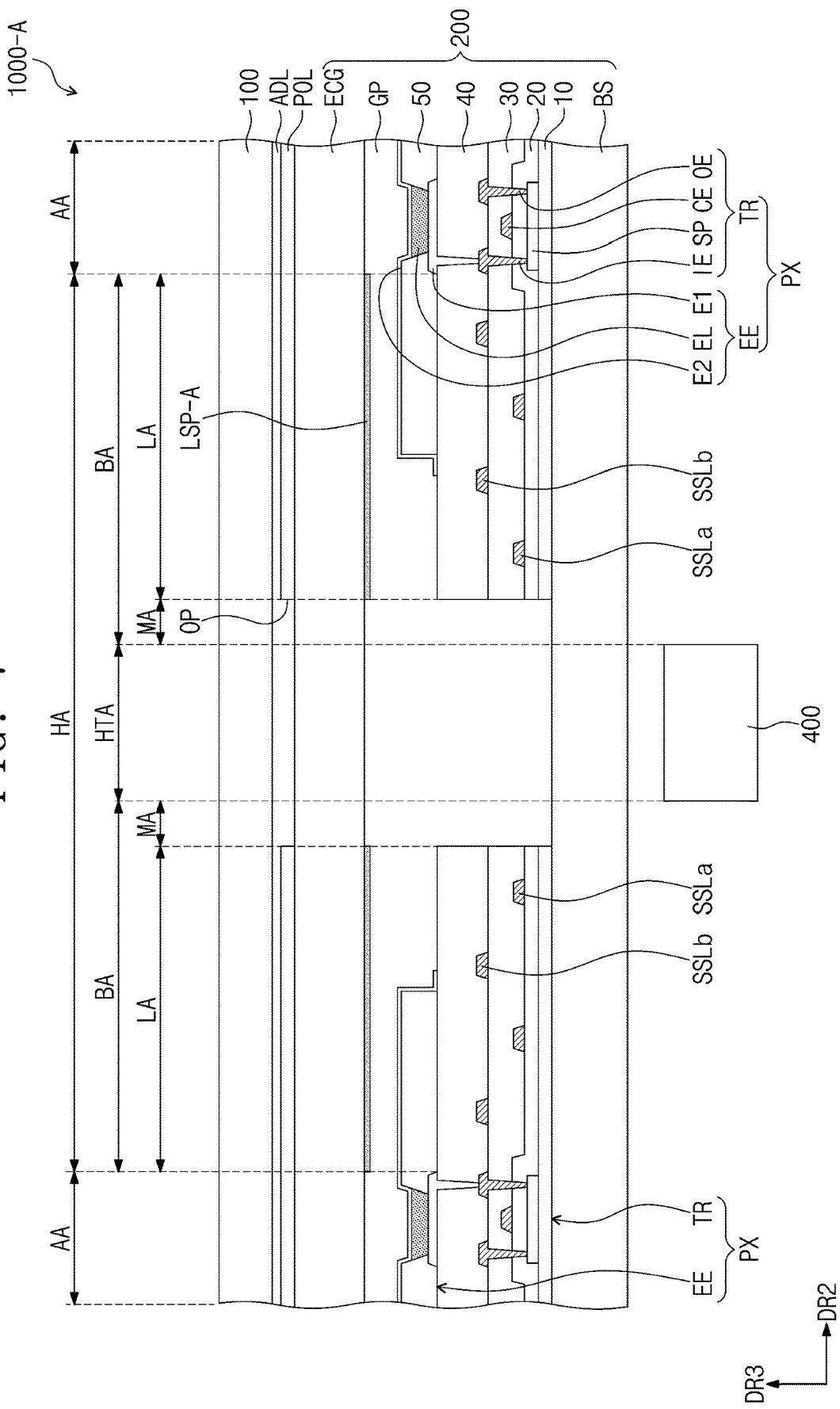
FIG. 7 is a cross-sectional view of an electronic apparatus according to some example embodiments of the inventive concept.

FIG. 7 is a cross-sectional view of an electronic apparatus according to some example embodiments of the inventive concept. FIG. 7 illustrates a region corresponding to the region of FIG. 6A for ease of description. Hereinafter, further details of some example embodiments of the inventive concept will be described with reference to FIG. 7. In the meantime, components the same as the components described with reference to FIGS. 1 to 6B are denoted by the same reference numerals, and some duplicate description thereof may not be given.

As illustrated in FIG. 7, in an electronic apparatus 1000-A, a light shielding pattern LSP-A may be provided in a shape corresponding to the wiring region LA. The light shielding pattern LSP-A may cover only a region, of the hole region HA, in which the anti-reflection layer POL, the insulating layers 10, 20, 30, 40, and 50, and the signal wires SSLa and SSLb are located, and may not overlap the margin region MA. The light shielding pattern LSP-A may be aligned with the inner surface of the opening OP.

In this embodiment, the margin region MA may have light transmittance substantially corresponding to the light transmittance of the hole transmissive region HTA. Because the light shielding pattern LSP-A exposes, of the hole region HA, the hole transmissive region HTA and a region having light transmittance corresponding to that of the hole transmissive region HTA, and selectively covers only the region in which components such as the signal wires SSLa and SSLb that may be viewed from the outside are located, there may occur an effect that, in the hole region HA, the area of a region transparently viewed increases and the area of a region opaquely viewed decreases. Accordingly, there may be an effect that the area of a bezel in the hole region HA is reduced.

Figure 8A:
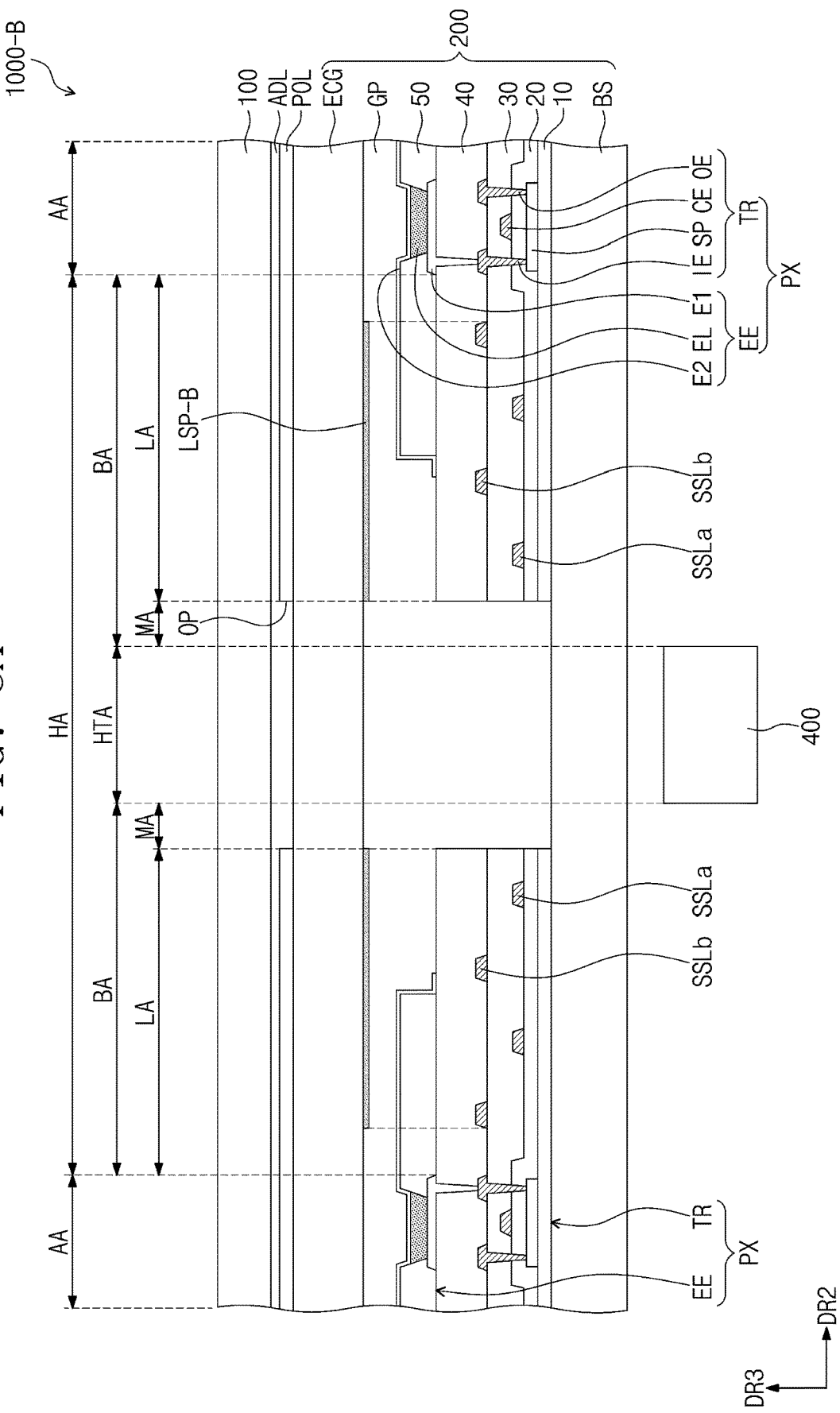
FIG. 8A is a cross-sectional view of an electronic apparatus according to some example embodiments of the inventive concept.
Figure 8B:
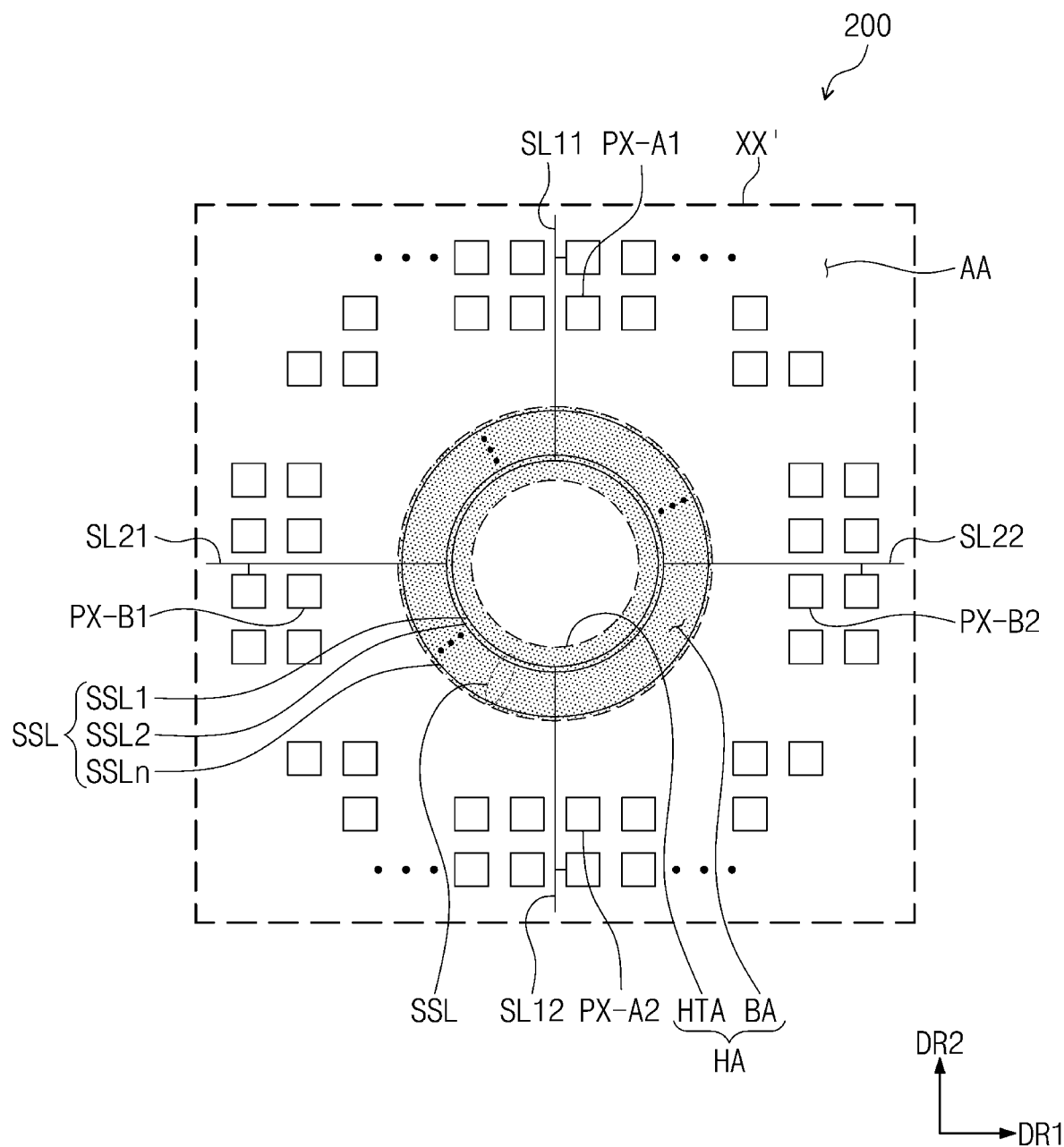
FIG. 8B is a plan view of an electronic panel according to some example embodiments of the inventive concept.

FIG. 8A is a cross-sectional view of an electronic apparatus according to some example embodiments of the inventive concept. FIG. 8B is a plan view of an electronic panel according to some example embodiments of the inventive concept. For ease of description, FIG. 8A illustrates a region corresponding to the region of FIG. 6A and FIG. 8B illustrates a region corresponding to the region of FIG. 4B. Hereinafter, further details of some example embodiments of the inventive concept will be described with reference to FIGS. 8A and 8B. In the meantime, components the same as the components described with reference to FIGS. 1 to 7 are denoted by the same reference numerals, and some duplicate description thereof may not be given.

As illustrated in FIGS. 8A and 8B, in an electronic apparatus 1000-B, a light shielding pattern LSP-B may have a shape overlapping only a region in which the signal wires SSLa and SSLb are located. That is, the light shielding pattern LSP-B may be formed so that the light shielding pattern LSP-B exposes the hole transmissive region HTA and the margin region MA of the hole region HA and overlaps only a region, of the wiring region LA, in which the signal wires SSLa and SSLb are located.

According to some example embodiments of the inventive concept, the light shielding pattern LSP-B may cover only a portion of the light shielding region BA. Accordingly, the substantial area of a bezel may be reduced in the hole region HA, and the aesthetics of the electronic apparatus 1000-B may be improved.

Figure 9A:
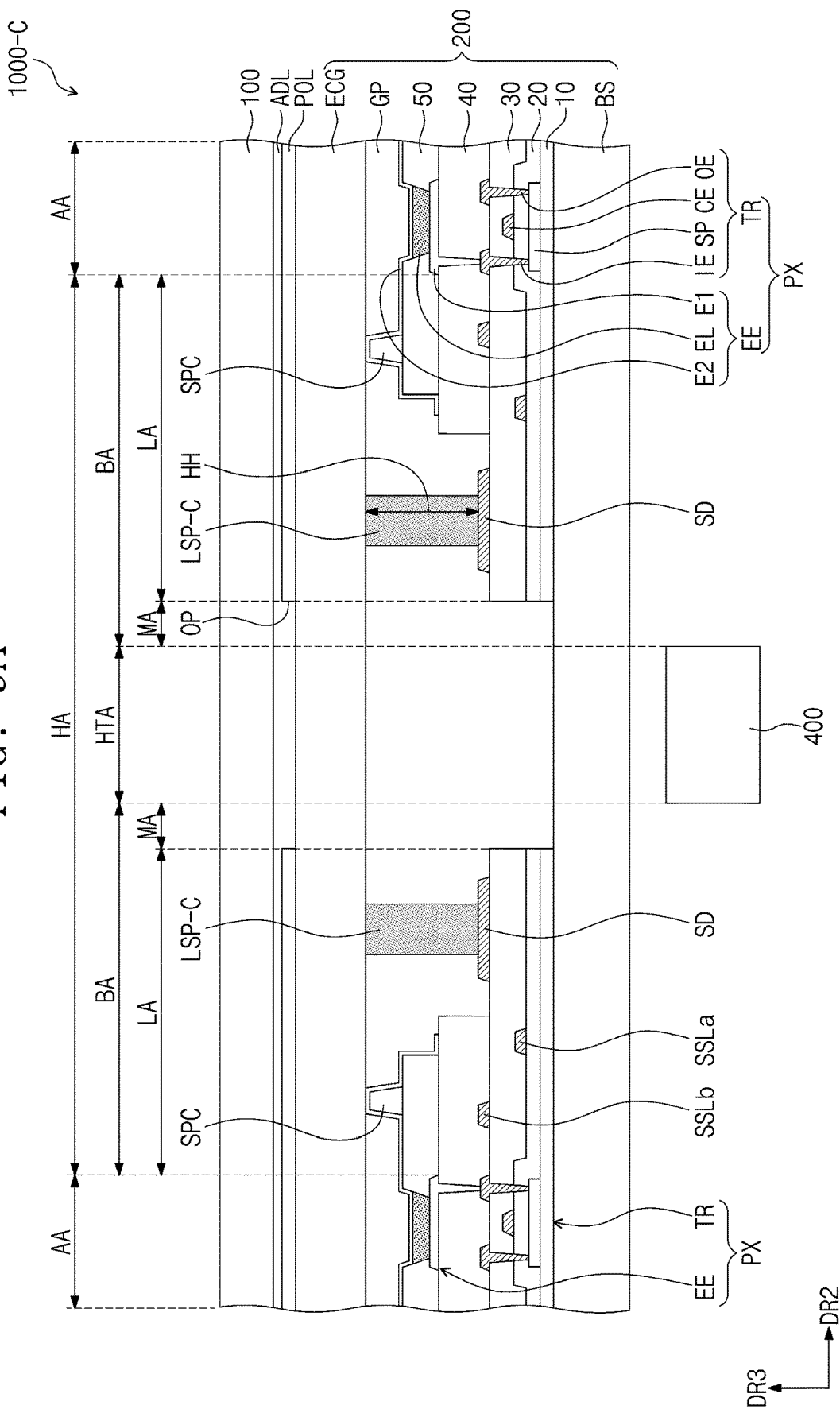
FIGS. 9A and 9B are cross-sectional views of electronic apparatuses according to some example embodiments of the inventive concept.
Figure 9B:
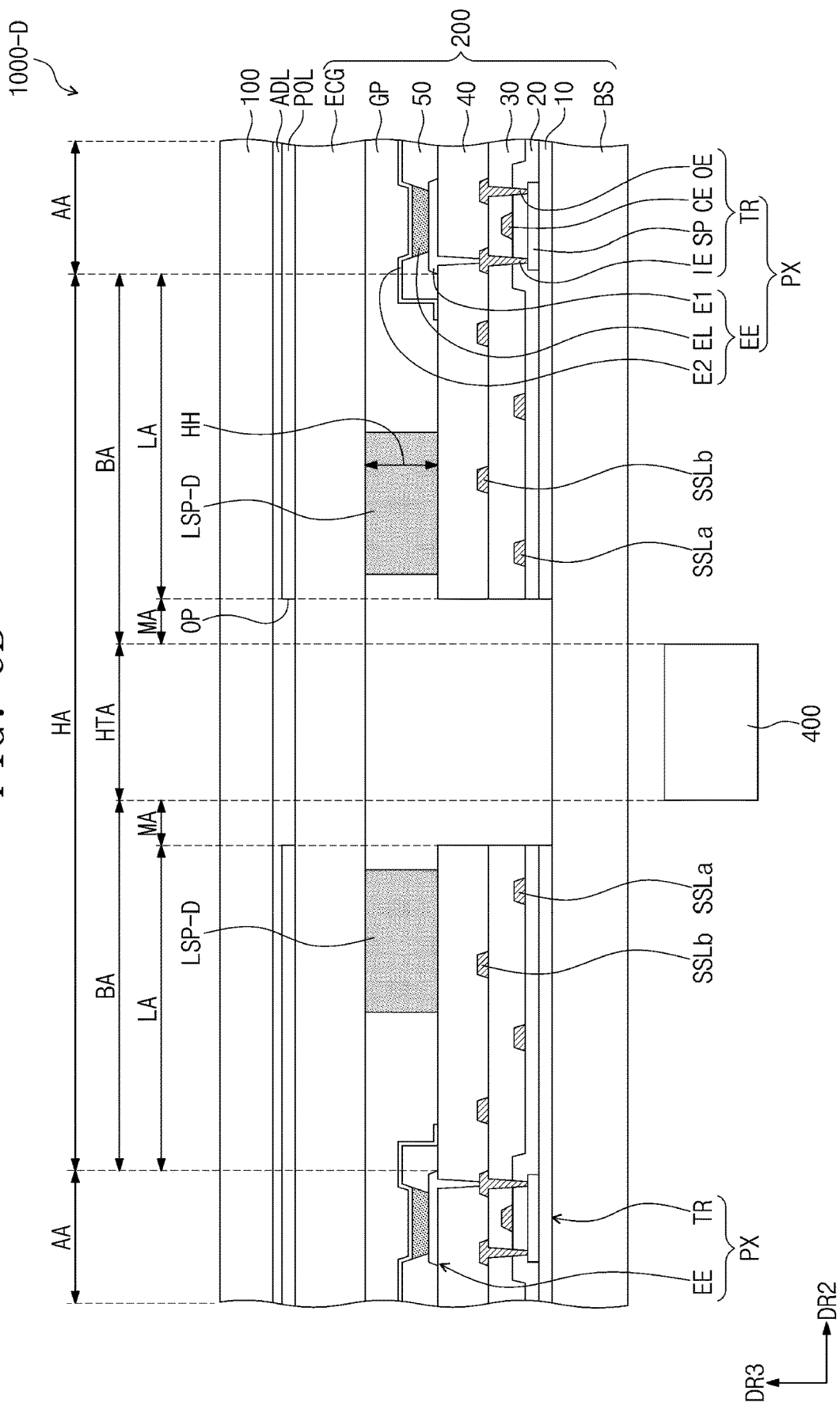

FIGS. 9A and 9B are cross-sectional views of electronic apparatuses according to some example embodiments of the inventive concept. For ease of description, FIGS. 9A and 9B illustrate a region corresponding to the region of FIG. 6A. Hereinafter, further details of some example embodiments of the inventive concept will be described with reference to FIGS. 9A and 9B. In the meantime, components the same as the components described with reference to FIGS. 1 to 8B are denoted by the same reference numerals, and some duplicate description thereof may not be given.

As illustrated in FIG. 9A, in an electronic apparatus 1000-C, a light shielding pattern LSP-C may serve as a support in the gap GP. For example, the light shielding pattern LSP-C may be formed with a height (e.g., a set or predetermined height) HH so as to serve as a support in the gap GP between the encapsulation substrate ECG and the base substrate BS. In this embodiment, the light shielding pattern LSP-C may be located on the third insulating layer 30 to serve as a support in a space, of the gap GP, between the third insulating layer 30 and the encapsulation substrate ECG.

In this embodiment, portions of the fourth insulating layer 40 and the fifth insulating layer 50 may be removed from a region, of the wiring region LA, in which the light shielding pattern LSP-C is located. Accordingly, the fourth insulating layer 40 and the fifth insulating layer 50 may be spaced apart from the light shielding pattern LSP-C when viewed in a plane.

A portion of the encapsulation substrate ECG in the wiring region LA may be supported by the light shielding pattern LSP-C, and another portion thereof may be supported by a spacer SPC located on the fifth insulating layer 50. The spacer SPC may serve as a support in a region of the gap GP overlapping the signal wires SSLa and SSLb, and the light shielding pattern LSP-C may serve as a support in a region of the gap GP spaced apart from the signal wires SSLa and SSLb.

Meanwhile, the electronic apparatus 1000-C according to this embodiment may further include a hole conductive pattern SD. The hole conductive pattern SD may be located in the wiring region LA and may be spaced apart from the signal wires SSLa and SSLb when viewed in a plane. The hole conductive pattern SD may be one of the signal lines that provide an electrical signal to the pixel PX, or may be a conductive pattern that electrically shields the periphery of the hole transmissive region HTA or is electrically floating from the pixel PX. Alternatively, according to some example embodiments, the hole conductive pattern SD may be one of signal lines that provide an electrical signal to the sensing unit.

The hole conductive pattern SD may be located on the third insulating layer 30 and exposed from the fourth insulating layer 40. The light shielding pattern LSP-C may be located on the hole conductive pattern SD. Accordingly, the light shielding pattern LSP-C may have a height obtained by subtracting the thickness of the hole conductive pattern SD from the height of a region of the gap GP between the third insulating layer 30 and the encapsulation substrate ECG.

Alternatively, as illustrated in FIG. 9B, a light shielding pattern LSP-D may be located on the fourth insulating layer 40 in an electronic apparatus 1000-D. A portion of the fifth insulating layer 50 may be removed from a region, of the wiring region LA, in which the light shielding pattern LSP-D is located. Accordingly, the fifth insulating layer 50 may be spaced apart from the light shielding pattern LSP-D when viewed in a plane.

The light shielding pattern LSP-D may serve as a support in a space, of the gap GP, defined between the fourth insulating layer 40 and the encapsulation substrate ECG. The light shielding pattern LSP-D may overlap the signal wires SSLa and SSLb when viewed in a plane. A height HH of the light shielding pattern LSP-D may correspond to a distance between the fourth insulating layer 40 and the encapsulation substrate ECG, and the width of the light shielding pattern LSP-D may have a variety of sizes as long as the light shielding pattern LSP-D may support a portion of the encapsulation substrate ECG in the wiring region LA, and is not limited to any one embodiment.

As illustrated in FIGS. 9A and 9B, the light shielding patterns LSP-C and LSP-D may serve as supports in the gap GP. The light shielding patterns LSP-C and LSP-D come in contact with the encapsulation substrate ECG and the components spaced apart from the encapsulation substrate ECG to define the gap GP, for example, the hole conductive pattern SD and the fourth insulating layer 40, respectively.

According to this embodiment, the light shielding patterns LSP-C and LSP-D may not only optically shield the wiring region LA, but also support a portion of the encapsulation substrate ECG in the wiring region LA. The light shielding patterns LSP-C and LSP-D may prevent the encapsulation substrate ECG from sagging in the hole region HA. As a result, defective optical viewing appearing in the hole region HA, for example, a defect that Newton's rings or the like is viewed may be prevented.

Figure 10:
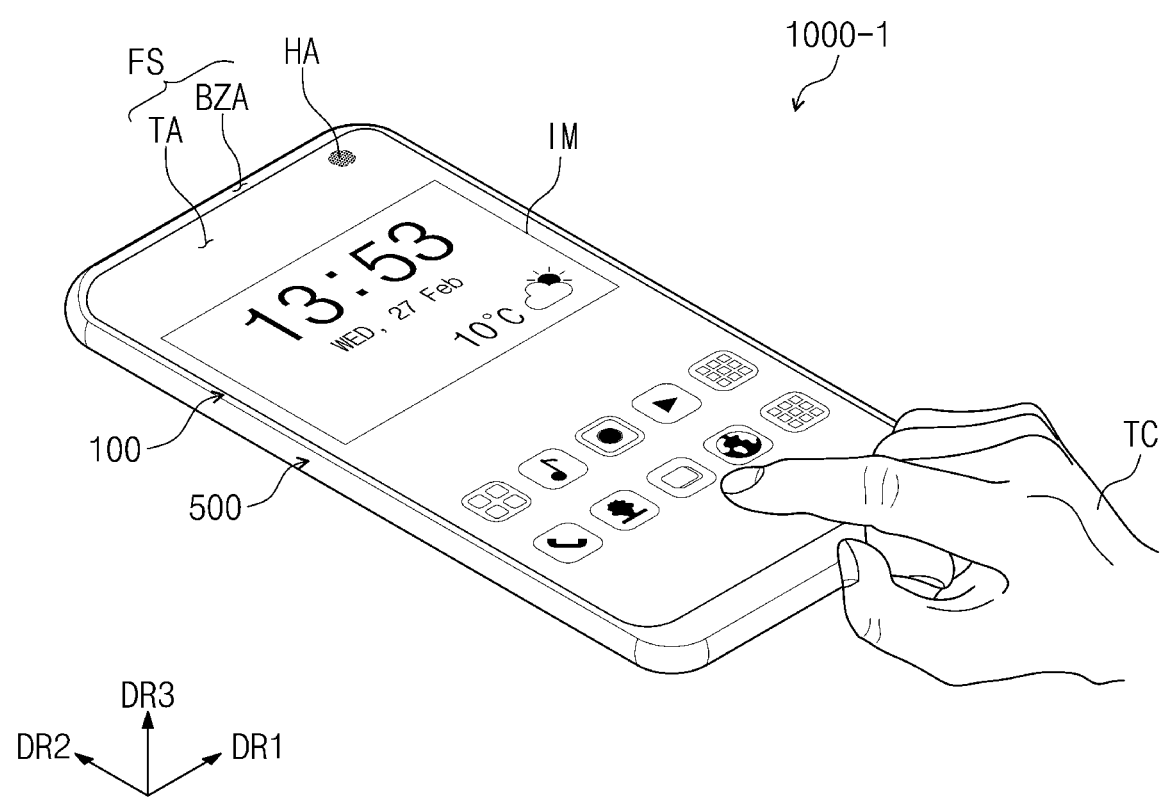
FIG. 10 is an assembled perspective view of an electronic apparatus according to some example embodiments of the inventive concept.
Figure 11:
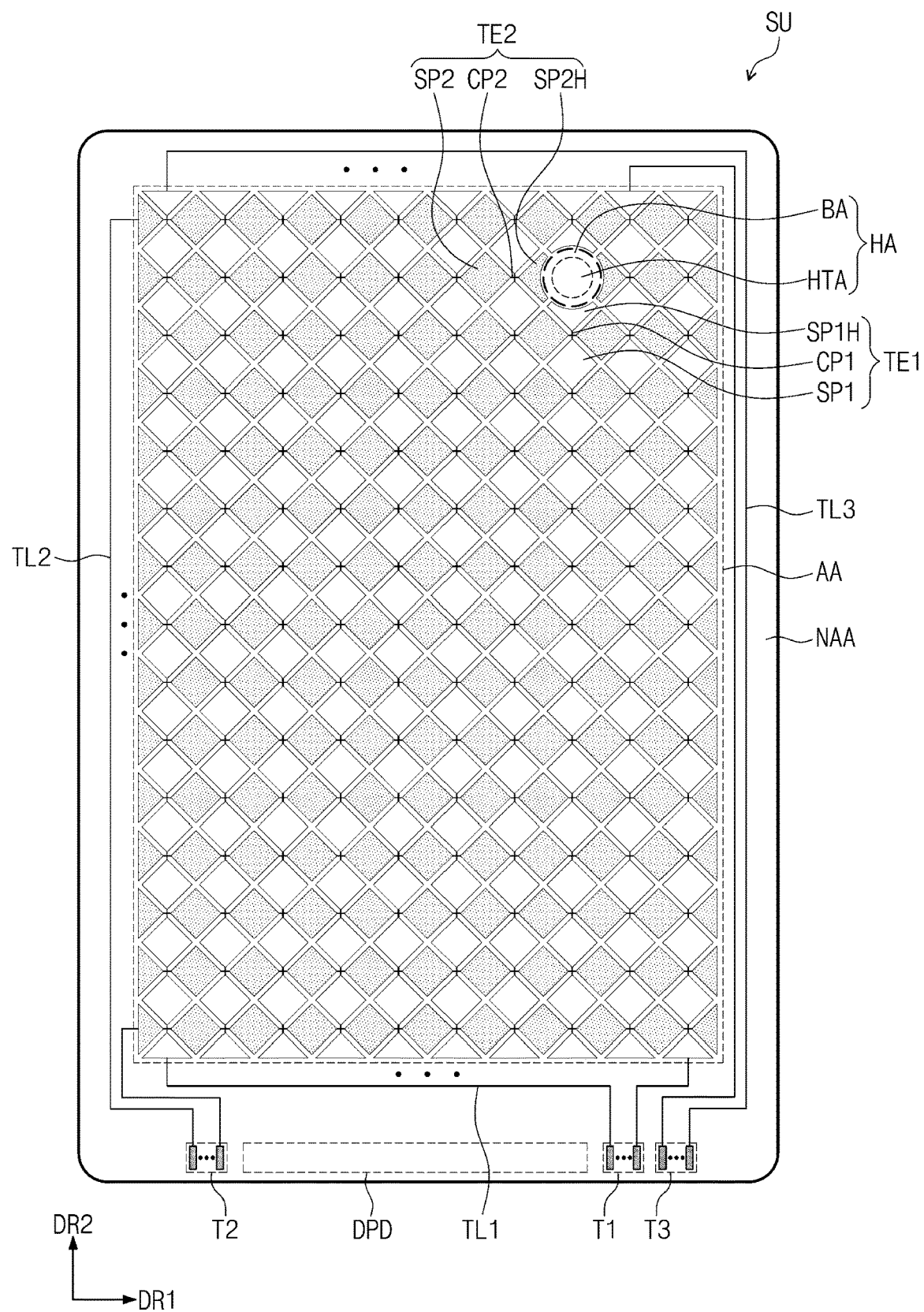
FIG. 11 is a plan view of an electronic panel according to some example embodiments of the inventive concept.
Figure 12:
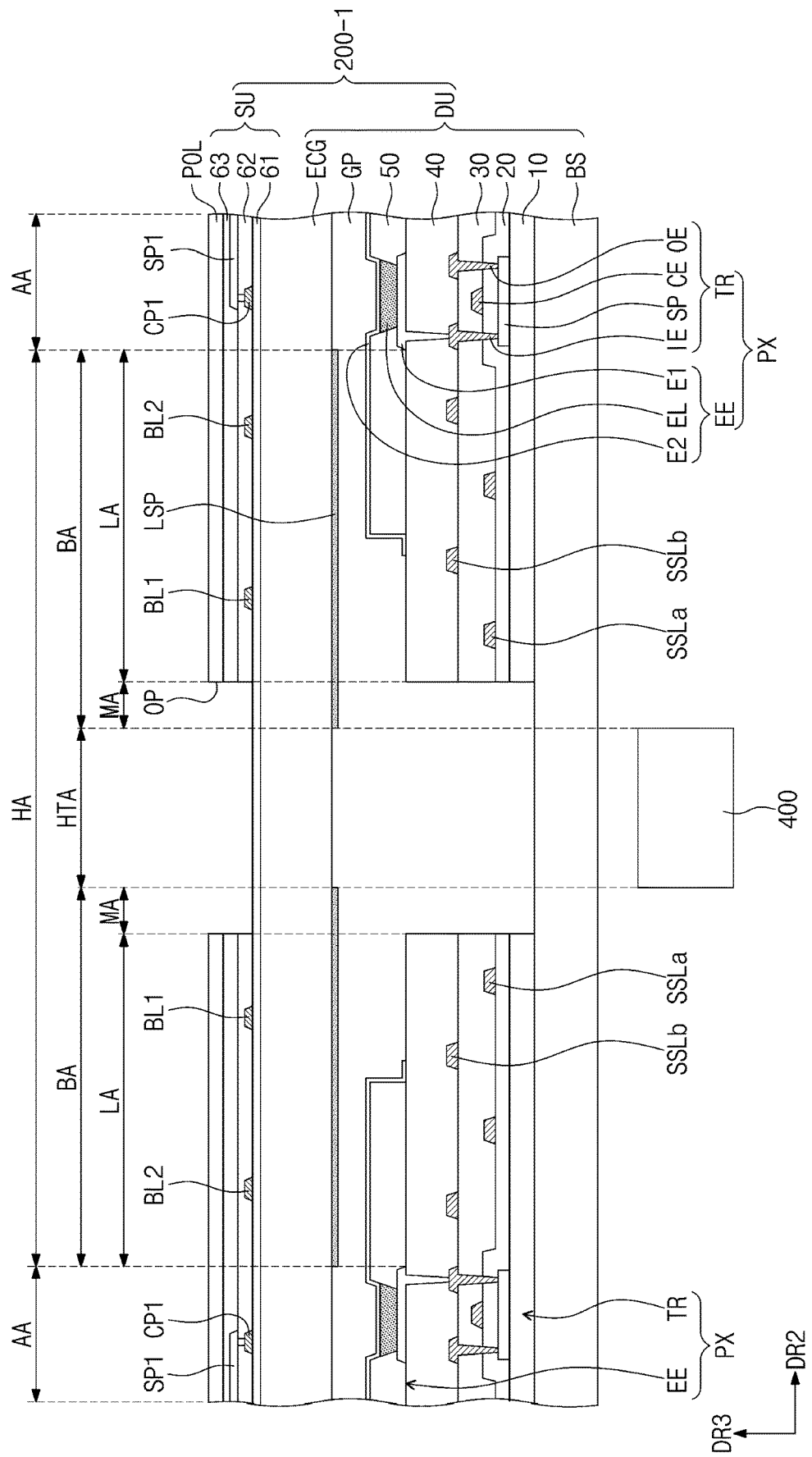
FIG. 12 is a cross-sectional view of the electronic apparatus according to some example embodiments of the inventive concept.

FIG. 10 is an assembled perspective view of an electronic apparatus according to some example embodiments of the inventive concept. FIG. 11 is a plan view of an electronic panel according to some example embodiments of the inventive concept. FIG. 12 is a cross-sectional view of the electronic apparatus according to some example embodiments of the inventive concept. For ease of description, FIG. 11 illustrates a region corresponding to the region of FIG. 4A, and some components are omitted in FIGS. 11 and 12. Hereinafter, further details of some example embodiments of the inventive concept will be described with reference to FIGS. 10 to 12. In the meantime, components the same as the components described with reference to FIGS. 1 to 9B are denoted by the same reference numerals, and some duplicate description thereof may not be given.

As illustrated in FIG. 10, an electronic apparatus 1000-1 may display an image IM and sense a user's input TC applied from the outside. The user input TC includes various types of external inputs such as a part of a user's body, light, heat, and pressure. In addition, the electronic apparatus 1000-1 may sense an input close to or adjacent to the electronic apparatus 1000-1 as well as an input contacting the same.

In this embodiment, the user's input TC is illustrated as a user's hand applied to a front surface of the electronic apparatus 1000-1. However, this is illustrated as one example, and the user's input TC may be provided in various types as described above. In addition, the electronic apparatus 1000-1 may sense, according to the structure thereof, the user's input TC that is applied to a side surface or a rear surface of the electronic apparatus 1000-1, and example embodiments of the inventive concept are not limited to any one embodiment.

As illustrated in FIGS. 10, 11 and 12, an electronic panel 200-1 constituting the electronic apparatus 1000-1 may include the display unit DU and the sensing unit SU. The display unit DU is located below the sensing unit SU. FIG. 11 illustrates components of the sensing unit SU viewed on a top surface of the electronic panel 200-1.

The sensing unit SU may sense the user's input TC to obtain position or strength information of the user's input TC. The sensing unit SU includes a plurality of first sensing electrodes TE1, a plurality of second sensing electrodes TE2, a plurality of sensing lines TL1, TL2, and TL3, and a plurality of sensing pads T1, T2, and T3.

The first sensing electrodes TE1 and the second sensing electrodes TE2 are arranged in the active region AA. The sensing unit SU may obtain information about the user input TC through a change in capacitance between the first sensing electrodes TE1 and the second sensing electrodes TE2.

The first sensing electrodes TE1 are arranged in the first direction DR1 and each of the first sensing electrodes TE1 extends in the second direction DR2. Each of the first sensing electrodes TE1 may include a first main pattern SP1, a first adjacent pattern SP1H, and a first connection pattern CP1. The first main pattern SP1, the first adjacent pattern SP1H, and the first connection pattern CP1 may be provided in plurality.

The first main pattern SP1 is located in the active region AA. The first main pattern SP1 is arranged to be spaced apart from the hole region HA. The first main pattern SP1 has a shape (e.g., a set or predetermined shape) and has a first area. In this embodiment, the first main pattern SP1 may have a rhombic shape. However, this is illustrated by way of example, and the first main pattern SP1 may have various shapes and is not limited to any one embodiment.

The first adjacent pattern SP1H is located adjacent to the hole region HA. The hole MH according to this embodiment passes through the sensing unit SU. The first adjacent pattern SP1H has a second area smaller than the first area of the first main pattern SP1. The first adjacent pattern SP1H may have a shape with a region overlapping the hole region HA removed from a rhombic shape the same as the shape of the first main pattern SP1.

In this embodiment, the first connection pattern CP1 extends in the second direction DR2. The first connection pattern CP1 is connected to the first main pattern SP1. The first connection pattern CP1 may be located between two of the first main patterns to connect the two of the first main patterns. In addition, the first connection pattern CP1 is located between the first main pattern SP1 and the first adjacent pattern SP1H to connect the first main pattern SP1 and the first adjacent pattern SP1H.

The second sensing electrodes TE2 are arranged in the second direction DR2 and each of the second sensing electrodes TE2 extends in the first direction DR1. Each of the second sensing electrodes TE2 may include a second main pattern SP2, a second adjacent pattern SP2H, and a second connection pattern CP2. The second main pattern SP2, the second adjacent pattern SP2H, and the second connection pattern CP2 may be provided in plurality.

The second main pattern SP2 is located to be spaced apart from the hole region HA. The second main pattern SP2 may be spaced apart from the first main pattern SP1. In this embodiment, the spacing apart between the first main pattern SP1 and the second main pattern SP2 may be spacing apart viewed on a cross section. The first main pattern SP1 and the second main pattern SP2 may not contact each other and thus may transmit and receive independent electrical signals.

In this embodiment, the second main pattern SP2 may have the same shape as the first main pattern SP1. For example, the second main pattern SP2 may have a rhombic shape. However, this is illustrated by way of example, and the second main pattern SP2 may have various shapes and is not limited to any one embodiment.

The second adjacent pattern SP2H is located adjacent to the hole region HA. The second adjacent pattern SP2H has a smaller area than the second main pattern SP2. The second adjacent pattern SP2H may have a shape with a region overlapping the hole region HA removed from a rhombic shape the same as the shape of the second main pattern SP2.

In this embodiment, the second connection pattern CP2 extends in the first direction DR1. The second connection pattern CP2 is connected to the second main pattern SP2. The second connection pattern CP2 may be located between two of the second main patterns to connect the two of the second main patterns. In addition, the second connection pattern CP2 is located between the second main pattern SP2 and the second adjacent pattern SP2H to connect the second main pattern SP2 and the second adjacent pattern SP2H.

In this embodiment, the first main pattern SP1, the second main pattern SP2, and the second connection pattern CP2 may be located on the same layer, and the first connection pattern CP1 may be located on a different layer. The first adjacent pattern SP1H is located on the same layer as the first main pattern SP1, and the second adjacent pattern SP2H is located on the same layer as the second main pattern SP2.

The sensing unit SU may include a plurality of sensing insulating layers 61, 62, and 63 sequentially laminated on the encapsulation substrate ECG. Each of the sensing insulating layers 61, 62, and 63 may include an organic film and/or an inorganic film. The first main pattern SP1, the second main pattern SP2, and the second connection pattern CP2 are located between a second sensing insulating layer 62 and a third sensing insulating layer 63 among the sensing insulating layers 61, 62, and 63. The first connection pattern CP1 is located between a first sensing insulating layer 61 and the second sensing insulating layer 62. The first main pattern SP1 and the first adjacent pattern SP1H may be connected to the first connection pattern CP1 through the second sensing insulating layer 62.

The sensing lines TL1, TL2, and TL3 are arranged in the peripheral region NAA. The sensing lines TL1, TL2, and TL3 may include first sensing lines TL1, second sensing lines TL2, and third sensing lines TL3.

The first sensing lines TL1 are respectively connected to the first sensing electrodes TE1. In this embodiment, the first sensing lines TL1 are respectively connected to lower ends of opposite ends of the first sensing electrodes TE1.

The second sensing lines TL2 are respectively connected to one ends of the second sensing electrodes TE2. In this embodiment, the second sensing lines TL2 are respectively connected to left ends of opposite ends of the second sensing electrodes TE2.

The third sensing lines TL3 are respectively connected to upper ends of the opposite ends of the first sensing electrodes TE1. According to some example embodiments of the inventive concept, the first sensing electrodes TE1 may be connected to the first sensing lines TL1 and the third sensing lines TL3. Accordingly, sensitivity depending on position may be uniformly maintained for the first sensing electrodes TE1 having a longer length than the second sensing electrodes TE2. On the other hand, this is illustrated by way of example, and the third sensing lines TL3 may be omitted in the sensing unit SU according to some example embodiments of the inventive concept and are not limited to any one embodiment.

The sensing pads T1, T2, and T3 are located in the peripheral region NAA. The sensing pads T1, T2, and T3 may be located in a region not overlapping the display pads DPD when viewed in a plane.

The sensing pads T1, T2, and T3 may include first sensing pads T1, second sensing pads T2, and third sensing pads T3. The second sensing pads T2 are respectively connected to the second sensing lines TL2 to provide an external signal to the second sensing electrodes TE2. The first sensing pads T1 are respectively connected to the first sensing lines TL1, and the third sensing pads T3 are respectively connected to the third sensing lines TL3, so that the first sensing pads T1 and the third sensing pads T3 are electrically connected to the first sensing electrodes TE1.

The sensing unit SU may further include a first connection line BL1 and a second connection line BL2 located in the hole region HA. The first connection line BL1 and the second connection line BL2 electrically connect two of the adjacent patterns located to be spaced apart from each other with the hole region HA therebetween. For example, the first connection line BL1 connects two of the first adjacent patterns SP1H that each constitute one of the first sensing electrodes TE1 and are located to be spaced apart from each other with the hole region HA therebetween. The second connection line BL2 connects two of the second adjacent patterns SP2H that each constitute one of the second sensing electrodes TE2 and are located to be spaced apart from each other with the hole region HA therebetween.

Each of the first connection line BL1 and the second connection line BL2 may have a shape extending to surround at least a portion of the edge of the hole transmissive region HTA. In this embodiment, the first connection line BL1 and the second connection line BL2 are illustrated to be located on the same layer. However, this is illustrated by way of example, and the first connection line BL1 and the second connection line BL2 may be located on different layers and are not limited to any one embodiment.

In this embodiment, the first connection line BL1 and the second connection line BL2 are located in the light shielding region BA and overlap the light shielding pattern LSP when viewed in a plane. The light shielding region BA is viewed in an opaque color by a user due to the light shielding pattern LSP. Accordingly, the first connection line BL1 and the second connection line BL2 may be difficult to be viewed.

In addition, according to some example embodiments of the inventive concept, the first connection line BL1 and the second connection line BL2 are covered by the anti-reflection layer POL. Accordingly, a problem that the first connection line BL1 and the second connection line BL2 are viewed due to the reflection of external light may be easily prevented. According to some example embodiments of the inventive concept, the light shielding region having a uniform color may also be provided in the hole region HA of the electronic apparatus 1000-1 including the sensing unit SU, and the aesthetics of the electronic apparatus 1000-1 may be improved.

Figure 13:
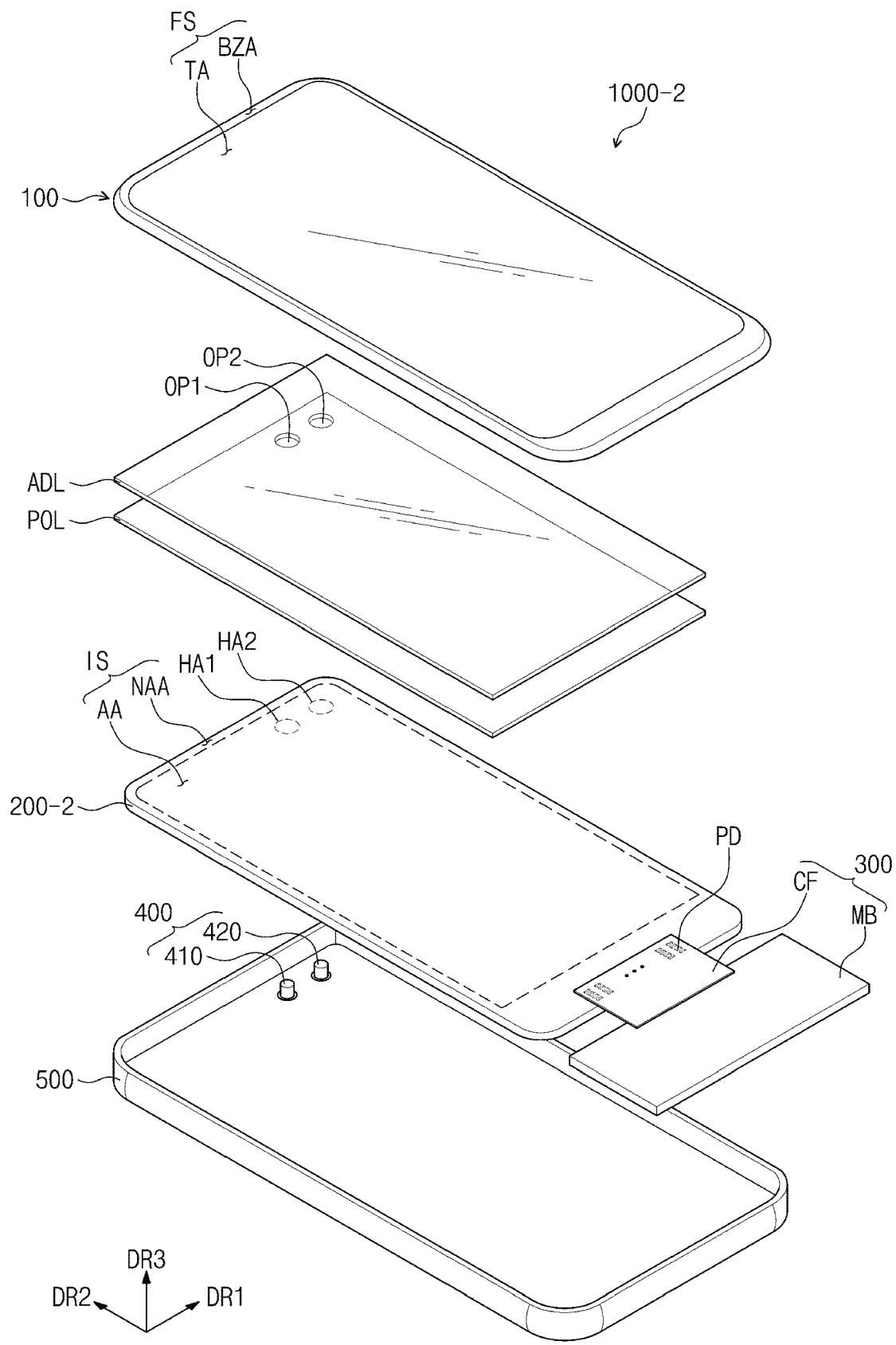
FIG. 13 is an exploded perspective view of an electronic apparatus according to some example embodiments of the inventive concept.
Figure 14A:
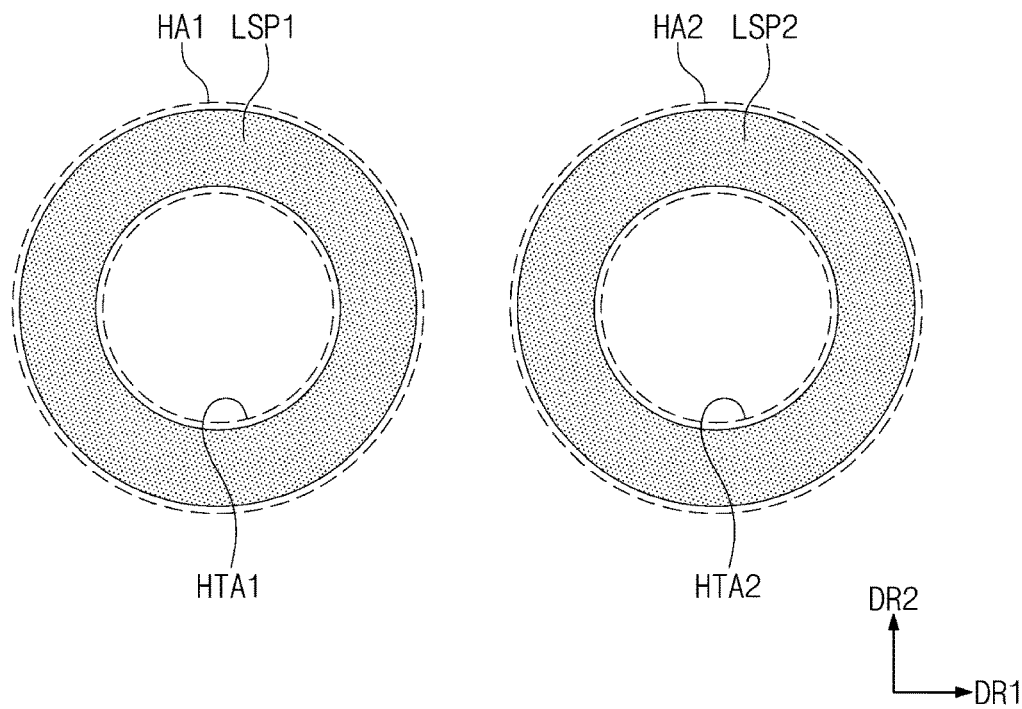
FIGS. 14A and 14B are plan views schematically illustrating portions of electronic panels according to some example embodiments of the inventive concept.
Figure 14B:
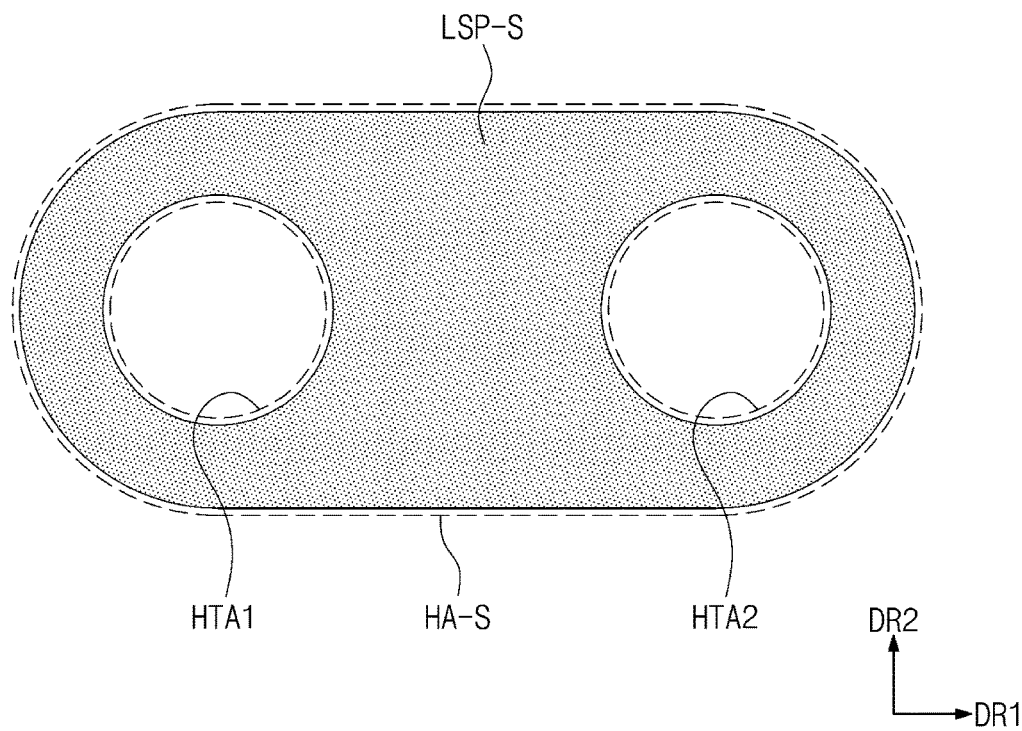

FIG. 13 is an assembled perspective view of an electronic apparatus according to some example embodiments of the inventive concept. FIGS. 14A and 14B are plan views schematically illustrating portions of electronic panels according to some example embodiments of the inventive concept. For ease of description, FIG. 13 is illustrated to correspond to FIG. 2, and FIGS. 14A and 14B illustrate regions corresponding to the region of FIG. 6B. Hereinafter, further details of some example embodiments of the inventive concept will be described with reference to FIGS. 13 to 14B. In the meantime, components the same as the components described with reference to FIGS. 1 to 12 are denoted by the same reference numerals, and some duplicate description thereof may not be given.

As illustrated in FIG. 13, an electronic apparatus 1000-2 may include the window 100, an electronic panel 200-2, an anti-reflection layer POL, the adhesive layer ADL, the circuit board 300, a plurality of electronic modules 410 and 420, and the outer case 500. Because the window 100, the circuit board 300, and the outer case 500 correspond to the components illustrated in FIG. 1, some duplicate description thereof may not be given.

The electronic modules 410 and 420 may each be any one of the modules constituting the first electronic module EM1 and the second electronic module EM2 illustrated in FIG. 3. For example, each of the electronic modules 410 and 420 may be a camera, a speaker, or a sensor such as a light sensor and a heat sensor.

A plurality of hole regions HA1 and HA2 may be defined in the electronic panel 200-2. The hole regions HA1 and HA2 may respectively correspond to the electronic modules 410 and 420. The electronic modules 410 and 420 may include a first module 410 overlapping a first hole region HA1 and a second module 420 overlapping a second hole region HA2. The first module 410 and the second module 420 may be the same or different from each other.

A plurality of openings OP1 and OP2 may be defined in the anti-reflection layer POL. The openings OP1 and OP2 may respectively overlap the hole regions HA1 and HA2, and may respectively correspond to the electronic modules 410 and 420. The anti-reflection layer POL according to some example embodiments of the inventive concept may increase light transmittance in the hole regions HA1 and HA2 and improve the sensitivity of the electronic modules 410 and 420 by providing the openings OP1 and OP2 respectively corresponding to the electronic modules 410 and 420.

Referring to FIG. 14A, a light shielding pattern may be provided in plurality and the plurality of light shielding patterns LSP1 and LSP2 may be located to correspond to the hole regions HA1 and HA2, respectively. For example, the electronic apparatus 1000-2 may include a first light shielding pattern LSP1 and a second light shielding pattern LSP2.

The first light shielding pattern LSP1 and the second light shielding pattern LSP2 are located to be spaced apart from each other when viewed in a plane defined by the first direction DR1 and the second direction DR2. The first light shielding pattern LSP1 may be located in a first hole region HA1 and may be provided in a ring shape surrounding a first hole transmissive region HTA1. The second light shielding pattern LSP2 may be located in a second hole region HA2 and may be provided in a ring shape surrounding a second hole transmissive region HTA2.

Alternatively, referring to FIGS. 13 and 14B, a light shielding pattern may be provided in one piece. For example, an electronic apparatus 1000-2 may include a single light shielding pattern LSP-S.

The light shielding pattern LSP-S may surround each of the first hole transmissive region HTA1 and the second hole transmissive region HTA2. The light shielding pattern LSP-S may be located in a single hole region HA-S surrounding the first hole transmissive region HTA1 and the second hole transmissive region HTA2, and may be provided in a shape in which openings respectively corresponding to the first hole transmissive region HTA1 and the second hole transmissive region HTA2 are formed. Accordingly, a single light shielding region surrounding the edges of the hole transmissive regions HTA1 and HTA2 may be provided.

According to some example embodiments of the inventive concept, the plurality of hole transmissive regions HTA1 and HTA2 respectively corresponding to the plurality of electronic modules 410 and 420 may be provided, and various shapes of light shielding regions may be provided by various shapes of light shielding patterns. Accordingly, design freedom and aesthetics of the electronic apparatus 1000-2 may be improved.

In addition, according to some example embodiments of the inventive concept, the light shielding patterns may be arranged to correspond to the plurality of hole transmissive regions HTA1 and HTA2, thereby preventing a region of the encapsulation substrate in each of the hole transmissive regions HTA1 and HTA2 from sagging. Accordingly, the problem that an optical defect in each of the hole transmissive regions HTA1 and HTA2 is viewed may be easily prevented.

According to some example embodiments of the inventive concept, by providing the light shielding region in the hole region overlapping the electronic module, the aesthetics of the electronic panel may be improved in a region adjacent to the electronic module.

In addition, according to some example embodiments of the inventive concept, the light shielding region may be formed using a current process, and thus the process may be simplified and the process cost may be reduced. Further, according to some example embodiments of the inventive concept, misalignment between other components such as the anti-reflection member and the light shielding region may be easily prevented.

Although the example embodiments of the inventive concept have been described herein, it is understood that various changes and modifications can be made by those skilled in the art within the spirit and scope of the inventive concept defined by the following claims and their equivalents.

Therefore, the example embodiments described herein are not intended to limit the technical spirit and scope of the present invention, and all technical spirit within the scope of the following claims or the equivalents will be construed as being included in the scope of the present invention.

What is claimed is:
1. An electronic panel comprising:
  a base substrate divided into a hole region including a hole transmissive region overlapping an electronic module when viewed in a plan view and a light shielding region adjacent to the hole transmissive region, an active region adjacent to the hole region, and a peripheral region adjacent to the active region;
a plurality of light emitting devices spaced apart from the hole region in the active region;
a light shielding pattern spaced apart from the hole transmissive region in the light shielding region; and
an encapsulation substrate on the base substrate and covering the light emitting devices,
wherein the light shielding pattern comprises frit.

2. The electronic panel of claim 1, wherein the frit comprises a vanadium oxide.

3. The electronic panel of claim 1, wherein the light shielding pattern is on a rear surface of the encapsulation substrate.

4. The electronic panel of claim 3, wherein the encapsulation substrate comprises glass.

5. The electronic panel of claim 1, wherein the electronic panel comprises a plurality of insulating layers between the base substrate and the encapsulation substrate and spaced apart from the encapsulation substrate,
wherein the insulating layers are spaced apart from the hole transmissive region when viewed in a plane.

6. The electronic panel of claim 5, wherein the light shielding pattern is in contact with any one of the encapsulation substrate and the insulating layers.

7. The electronic panel of claim 5, further comprising a hole conductive pattern in the hole region and spaced apart from the hole transmissive region on any one of the insulating layers,
wherein the light shielding pattern is in contact with the hole conductive pattern and the encapsulation substrate.

8. The electronic panel of claim 1, further comprising:
a window on the encapsulation substrate; and
an anti-reflection layer between the encapsulation substrate and the window,
wherein an opening penetrating the anti-reflection layer and overlapping the hole transmissive region is defined.

9. The electronic panel of claim 8, wherein an inner surface of the opening overlaps the light shielding pattern when viewed in the plan view.

10. The electronic panel of claim 1, further comprising a sensing unit on the encapsulation substrate and includes a plurality of sensing electrodes,
wherein the sensing electrodes are spaced apart from the hole transmissive region when viewed in the plan view.

11. An electronic apparatus comprising:
an electronic module; and
an electronic panel overlapping the electronic module when viewed in a plan view,
wherein the electronic panel comprises:
a base substrate divided into a hole region including a hole transmissive region overlapping the electronic module when viewed in the plan view and a light shielding region adjacent to the hole transmissive region, an active region adjacent to the hole region, and a peripheral region adjacent to the active region;
a plurality of light emitting devices spaced apart from the hole region in the active region;
a light shielding pattern spaced apart from the hole transmissive region in the light shielding region;
an encapsulation substrate on the base substrate and including a rear surface facing the light emitting devices and a front surface opposite to the rear surface; and
a sealing member bonding the encapsulation substrate and the base substrate,
wherein the light shielding pattern is on the rear surface of the encapsulation substrate.

12. The electronic apparatus of claim 11, wherein the light shielding pattern comprises frit.

13. The electronic apparatus of claim 12, wherein the light shielding pattern comprises a same material as the sealing member.

14. The electronic apparatus of claim 11, further comprising:
a window on the front surface of the encapsulation substrate; and
an anti-reflection layer between the window and the encapsulation substrate,
wherein the window overlaps the hole region when viewed in the plan view, and
an opening penetrating the anti-reflection layer and overlapping the hole region.

15. The electronic apparatus of claim 14, wherein an inner surface of the opening is aligned with an end of the light shielding pattern.

16. The electronic apparatus of claim 14, wherein an inner surface of the opening overlaps the light shielding pattern when viewed in the plan view.

17. The electronic apparatus of claim 14, wherein a light transmittance of a region of the window overlapping the hole region is equal to a light transmittance of a region of the window overlapping the active region.

18. The electronic apparatus of claim 11, wherein the hole transmissive region is surrounded by the light shielding pattern when viewed in the plan view.

19. The electronic apparatus of claim 18, wherein
the hole transmissive region comprises a plurality of hole transmissive regions spaced apart from each other, and
the light shielding pattern surrounds each of the plurality of hole transmissive regions.

20. The electronic apparatus of claim 18, wherein
each of the hole transmissive region and the light shielding pattern is provided in plurality, the plurality of hole transmissive regions are spaced apart from each other, and the plurality of light shielding patterns are spaced apart from each other, and
the plurality of light shielding patterns respectively surround the plurality of hole transmissive regions.

21. The electronic apparatus of claim 11, wherein the electronic module comprises at least one of a camera, a speaker, a light sensor, or a heat sensor.

22. The electronic apparatus of claim 11, wherein the electronic panel comprises signal wires in the light shielding region and connected to light emitting devices adjacent to the hole region among the light emitting devices,
wherein the signal wires are covered by the light shielding pattern when viewed in the plan view.

23. The electronic apparatus of claim 22, wherein the light shielding pattern is spaced apart from the signal wires when viewed in the plan view.

24. The electronic apparatus of claim 22, further comprising a hole conductive pattern in the light shielding region and spaced apart from the signal wires to be electrically insulated from the signal wires,
wherein the light shielding pattern is in contact with the hole conductive pattern.

25. The electronic apparatus of claim 11, wherein the electronic apparatus comprises a plurality of insulating layers between the base substrate and the encapsulation substrate and spaced apart from the encapsulation substrate, wherein the light shielding pattern is in contact with any one of the insulating layers.

\* \* \* \* \*